United States Patent
Murphy et al.

(10) Patent No.: US 11,658,354 B2
(45) Date of Patent: May 23, 2023

(54) BATTERY LIFE ASSESSMENT AND CAPACITY RESTORATION

(71) Applicant: Titan Advanced Energy Solutions, Inc., Salem, MA (US)

(72) Inventors: Shawn Murphy, Swampscott, MA (US); Ashish Sreedhar, Boston, MA (US); Vincent Yuan-Hsiang Lee, Winchester, MA (US); Steven Africk, Boston, MA (US)

(73) Assignee: TITAN ADVANCED ENERGY SOLUTIONS, INC., Salem, MA (US)

( * ) Notice: Subject to any disclaimer, the term of this patent is extended or adjusted under 35 U.S.C. 154(b) by 44 days.

(21) Appl. No.: 16/617,932

(22) PCT Filed: May 30, 2018

(86) PCT No.: PCT/US2018/035039
§ 371 (c)(1),
(2) Date: Nov. 27, 2019

(87) PCT Pub. No.: WO2018/222658
PCT Pub. Date: Dec. 6, 2018

(65) Prior Publication Data
US 2020/0106137 A1    Apr. 2, 2020

Related U.S. Application Data

(60) Provisional application No. 62/634,098, filed on Feb. 22, 2018, provisional application No. 62/512,616, filed on May 30, 2017.

(51) Int. Cl.
*H01M 10/00* (2006.01)
*H01M 10/48* (2006.01)
(Continued)

(52) U.S. Cl.
CPC .............. *H01M 10/48* (2013.01); *G01N 29/07* (2013.01); *G01R 31/382* (2019.01); *G01S 15/02* (2013.01);
(Continued)

(58) Field of Classification Search
CPC ............. H01M 10/0525; H01M 10/42; H01M 10/425; H01M 10/48; H01M 2010/4271;
(Continued)

(56) References Cited

U.S. PATENT DOCUMENTS

| 4,337,661 A | 7/1982 | Kretz |
| 4,442,700 A | 4/1984 | Swoboda |

(Continued)

FOREIGN PATENT DOCUMENTS

| CN | 103187595 A | 7/2013 |
| CN | 103837581 A | 6/2014 |

(Continued)

OTHER PUBLICATIONS

Balbuena et al., Table of Contents and Preface for *Lithium-Ion Batteries: Solid-Electrolyte Interphase*, Imperial College Press, London, UK, 2004.

(Continued)

*Primary Examiner* — Naum Levin
(74) *Attorney, Agent, or Firm* — RowanTree Law Group, PLLC; Frederick F. Rosenberger

(57) ABSTRACT

Described herein are embodiments of methods and apparatus for determining the SoC and SoH a lithium ion battery and for restoring capacity to a lithium ion battery. Some embodiments provide a method and apparatus including an ultrasound transducer designed to measure characteristics of a lithium ion battery in order to determine the SoC and SoH of the lithium ion battery, and to disrupt the SSEI layer inside the lithium ion battery. Several other methods for (Continued)

determination of SoC and SoH and disruption of the SSEI layer are also described. Use of such methods and apparatus may be advantageous in assessing a state of the lithium ion battery, as well as rejuvenating a lithium ion battery and increasing its life span.

28 Claims, 22 Drawing Sheets

(51) Int. Cl.
    *G01R 31/382*     (2019.01)
    *G01N 29/07*     (2006.01)
    *G01S 15/02*     (2006.01)
    *H01M 10/0525*     (2010.01)
    *H01M 10/42*     (2006.01)

(52) U.S. Cl.
    CPC ..... *H01M 10/0525* (2013.01); *H01M 10/425* (2013.01); *H01M 2010/4271* (2013.01)

(58) Field of Classification Search
    CPC ....... G01N 2291/011; G01N 2291/014; G01N 2291/015; G01N 2291/048; G01N 19/00; G01N 29/07; G01N 29/11; G01N 29/12; G01N 2291/2697; G01N 23/04; G01N 3/08; Y02E 60/10; G01R 31/382; G01R 15/02; G01S 15/02
    See application file for complete search history.

(56) References Cited

U.S. PATENT DOCUMENTS

| | | | |
|---|---|---|---|
| 5,750,895 A | 5/1998 | Chern et al. | |
| 6,520,018 B1 | 2/2003 | Flores-Lira | |
| 8,104,341 B2 | 1/2012 | Lagergren et al. | |
| 8,231,533 B2 | 7/2012 | Buchalter | |
| 8,722,227 B2 * | 5/2014 | Chiang | B60L 50/72 |
| | | | 429/105 |
| 9,393,214 B2 * | 7/2016 | Fichtner | C09C 1/24 |
| 9,620,784 B2 * | 4/2017 | Azami | H01M 10/0525 |
| 9,970,906 B2 | 5/2018 | Lee et al. | |
| 10,014,561 B2 | 7/2018 | Sood et al. | |
| 10,132,781 B2 | 11/2018 | Steingart et al. | |
| 10,481,016 B2 | 11/2019 | Hsieh et al. | |
| 10,502,793 B2 | 12/2019 | Hsieh et al. | |
| 10,629,966 B2 | 4/2020 | Biswas et al. | |
| 10,673,101 B2 | 6/2020 | Sood et al. | |
| 10,684,262 B2 | 6/2020 | Steingart et al. | |
| 10,809,231 B2 | 10/2020 | Hsieh et al. | |
| 10,809,310 B2 | 10/2020 | Hsieh et al. | |
| 2004/0191609 A1 * | 9/2004 | Tamura | H01M 4/134 |
| | | | 429/50 |
| 2006/0055400 A1 * | 3/2006 | Safai | G01N 23/04 |
| | | | 324/232 |
| 2007/0031732 A1 * | 2/2007 | Chiang | C01B 25/45 |
| | | | 429/231.95 |
| 2007/0292760 A1 | 12/2007 | Patoux et al. | |
| 2008/0028860 A1 | 2/2008 | Refko et al. | |
| 2008/0133156 A1 | 6/2008 | Redko et al. | |
| 2008/0137807 A1 * | 6/2008 | Yukisada | H01M 10/4285 |
| | | | 378/45 |
| 2008/0170666 A1 * | 7/2008 | Coombs | A61B 6/56 |
| | | | 378/101 |
| 2011/0030477 A1 | 2/2011 | Cousins | |
| 2011/0183168 A1 | 7/2011 | Johnnie et al. | |
| 2011/0187377 A1 | 8/2011 | Boysen et al. | |
| 2011/0200848 A1 * | 8/2011 | Chiang | H01M 8/20 |
| | | | 429/4 |
| 2012/0135337 A1 | 5/2012 | Herchen et al. | |
| 2012/0148880 A1 | 6/2012 | Schaefer et al. | |
| 2012/0283605 A1 | 11/2012 | Lewis, Jr. | |
| 2013/0269436 A1 | 10/2013 | Couse et al. | |
| 2013/0302655 A1 | 11/2013 | Deveau et al. | |
| 2013/0335094 A1 | 12/2013 | Adams et al. | |
| 2015/0107989 A1 | 4/2015 | Tateno | |
| 2016/0079592 A1 * | 3/2016 | Li | H01M 10/0525 |
| | | | 429/231.5 |
| 2016/0084911 A1 | 3/2016 | Mensah-Brown et al. | |
| 2016/0141732 A1 | 5/2016 | Kuhne et al. | |
| 2016/0223498 A1 | 8/2016 | Steingart et al. | |
| 2016/0308196 A1 * | 10/2016 | Matsubara | H01M 4/364 |
| 2017/0005497 A1 * | 1/2017 | Sherstyuk | H01M 10/441 |
| 2017/0040651 A1 | 2/2017 | Okayama et al. | |
| 2017/0104213 A1 * | 4/2017 | Huang | H01M 4/1393 |
| 2017/0219660 A1 | 8/2017 | Christensen et al. | |
| 2018/0287219 A1 | 10/2018 | Sood et al. | |
| 2018/0366778 A1 * | 12/2018 | Liu | H01G 11/06 |
| 2019/0044185 A1 * | 2/2019 | Gogotsi | H01M 10/0568 |
| 2019/0088981 A1 * | 3/2019 | Chen | H01M 4/13 |
| 2019/0094189 A1 | 3/2019 | Hsieh et al. | |
| 2019/0207274 A1 | 7/2019 | Ladpli et al. | |
| 2019/0219547 A1 | 7/2019 | Steingart et al. | |
| 2019/0237818 A1 | 8/2019 | Friend et al. | |
| 2020/0096398 A1 | 3/2020 | Hsieh et al. | |
| 2020/0284766 A1 * | 9/2020 | Shen | H01M 10/0525 |
| 2020/0321665 A1 | 10/2020 | Biswas et al. | |
| 2020/0381736 A1 * | 12/2020 | Mitlin | C01B 32/196 |
| 2021/0175553 A1 * | 6/2021 | Van Tassell | G01R 31/392 |
| 2021/0249702 A1 * | 8/2021 | Murphy | G01N 29/032 |

FOREIGN PATENT DOCUMENTS

| | | | |
|---|---|---|---|
| CN | 106153732 A | | 11/2016 |
| CN | 109655127 A | | 4/2019 |
| CN | 110031548 A | | 7/2019 |
| JP | S62-56809 A | | 3/1987 |
| JP | 2001-334264 A | | 12/2001 |
| JP | 2009-043469 A | | 2/2009 |
| JP | 2009048797 A | * | 3/2009 |
| JP | 2012-209246 A | | 10/2012 |
| JP | 2012-234936 A | | 11/2012 |
| JP | 2012-257367 A | | 12/2012 |
| JP | 2013-137249 A | | 7/2013 |
| JP | 2015-021827 A | | 2/2015 |
| JP | 2015-060775 A | | 3/2015 |
| JP | 2017-033825 A | | 2/2017 |
| KR | 20150026172 A | | 3/2015 |
| WO | WO 2015/023820 A2 | | 2/2015 |
| WO | WO 2018/085492 A1 | | 5/2018 |
| WO | WO 2018/085498 A1 | | 5/2018 |
| WO | WO 2018/085501 A1 | | 5/2018 |
| WO | WO 2018/107140 A1 | | 6/2018 |
| WO | WO 2019/067494 A1 | | 4/2019 |

OTHER PUBLICATIONS

Bluemtech webpage for WaterGel Ultrasound Solid Gel Pad [retrieved Jul. 8, 2014]. Retrieved from the Internet: <URL: http://bluemtech.en.ec21.com/Ultrasound_Solid_Gel_Pad_-WATERGEL---8129413_8129732.html>.
Ginzel et al., "Ultrasonic properties of a new low attenuation dry couplant elastomer," Ginzel Brothers & Associates Ltd., Apr. 1994.
Goldman et al., "Strain anisotropies and self-limiting capacities in single-crystalline 3D silicon microstructures: Models for high energy density lithium-ion battery anodes," *Advanced Functional Materials*, 2011, 21(13): pp. 2412-2422.
Klucinec, B., "The Effectiveness of the Aquaflex Gel Pad in the Transmission of Acoustic Energy," Journal of Athletic Training, Dec. 1996, 31(4): pp. 313-317.
Kumai et al., "Gas generation mechanism due to electrolyte decomposition in commercial lithium-ion cell," *Journal of Power Sources*, 1999, 81-82: pp. 715-719.
Med-Electronics listing for Parker Laboratories AquaFlex Ultrasound Gel Pad [retrieved Jul. 8, 2014]. Retrieved from the Internet: <URL: http://www.med-electronics.com/Parker-Laboratories-AquaFlex-Ultrasound-Gel-Pad-p/pli-aquaflex.htm>.
Meissner et al., "Battery monitoring and electrical energy management precondition for future vehicle electric power systems," *Journal of Power Sources*, 2003, 116(1): pp. 79-98.

(56) References Cited

OTHER PUBLICATIONS

Ng et al., "Enhanced coulomb counting method for estimating state-of-charge and state-of-health of lithium-ion batteries," *Applied Energy*, 2009, 86(9): pp. 1506-1511.
Ohsaki et al., "Overcharge reaction of lithium-ion batteries," *Journal of Power Sources*, 2005, 146(1): pp. 97-100.
Plett, G.L., "Extended Kalman filtering for battery management systems of LiPB-based HEV battery packs, Part 3. State and parameter estimation," *Journal of Power Sources*, 2004, 134(2): pp. 277-292.
Pop et al., "State-of-the-art of battery state-of-charge determination," *Measurement Science and Technology*, 2005, 16(12): pp. R93-R110.
Selfridge, A.R., "Approximate material properties in isotropic materials," *IEEE Transactions on Sonics and Ultrasonics*, May 1985, SU-32(3): pp. 381-394.
Sood et al., "Health monitoring of lithium-ion batteries," *Electronic Device Failure Analysis*, 2014, 2: pp. 4-14.
Sood et al., "Lithium-ion battery degradation mechanism and failure analysis methodology," *ISTFA 2012: Conference Proceedings from the 38th International Symposium for Testing and Failure Analysis*, Nov. 2012, pp. 239-249.
Williard et al., "Disassembly methodology for conducting failure analysis on lithium-ion batteries," *J. Mater. Sci.: Mater. Electron.*, 2011, 22(10): pp. 1616-1630.
Xing et al., "Battery management systems in electric and hybrid vehicles," *Energies*, 2011, 4(11): pp. 1840-1857.
Zimmerman, A.H., "Self-discharge losses in lithium-ion cells," *IEEE Aerospace and Electronic Systems*, 2004, pp. 19-24.
International Search Report and Written Opinion, dated Sep. 11, 2018, in International Application No. PCT/US2018/035039.
Office Action, dated Nov. 18, 2021, in Taiwanese Patent Application No. 107118839. (18 pages).
Office Action, dated May 31, 2022, in Japanese Application No. 2019-566829. (14 pages).
CN Office Action, dated Aug. 30, 2022 (Aug. 30, 2022), in Chinese Application No. 201880048887.8. (15 pages).

\* cited by examiner

BATTERY LIFE ASSESSMENT AND CAPACITY RESTORATION

RELATED APPLICATIONS

This Application claims priority to U.S. Provisional Application Ser. No. 65/512,616, filed on May 30, 2017, and to U.S. Provisional Application Ser. No. 62/634,098, filed on Feb. 22, 2018, both of which applications are incorporated by reference in their entirety.

BACKGROUND

There are several chemistries for rechargeable batteries, and one of the most dominant is the lithium ion battery system. Lithium ion batteries have seen widespread usage in portable electronic devices (cellphones, laptops, cameras, etc.), electric vehicles, and, in recent years, as grid level storage and back-up. Lithium ion batteries have high volumetric and gravimetric energy density, high rate capability, low calendric aging, thermal stability, and a declining cost.

SUMMARY

In one embodiment, there is provided a method and apparatus for determining the State of Charge (SoC) and State of Health (SoH) of a lithium ion battery, comprising at least one ultrasound or audio frequency transducer configured to measure physical and chemical characteristics of the lithium ion battery.

In another embodiment, there is provided a method and apparatus for determining the SoC and SoH of a lithium ion battery, comprising at least one accelerometer, strain gauge, and/or electro-optical sensor configured to measure motion of the lithium ion battery in response to a stimulus.

In another embodiment, there is provided a method and apparatus for determining the SoC and SoH of a lithium ion battery, comprising measuring a surface response to an acoustic stimulus, a transmitted acoustic wave, and/or a reflected acoustic wave using acoustic and/or vibration sensors.

In another embodiment, there is provided a method and apparatus for determining the SoC and SoH of a lithium ion battery, comprising at least one shaker and at least one accelerometer configured to measure motion of the lithium ion battery due to the shaker.

In another embodiment, there is provided a method and apparatus for determining the SoC and SoH of a lithium ion battery, comprising measuring the bending modulus of the lithium ion battery.

In another embodiment, there is provided a method and apparatus for determining the SoC and SoH of a lithium ion battery, comprising measuring the compressibility modulus of the lithium ion battery.

In another embodiment, there is provided a method and apparatus for determining the SoC and SoH of a lithium ion battery, comprising measuring the thickness of the lithium ion battery.

In another embodiment, there is provided a method and apparatus for determining the SoC and SoH of a lithium ion battery, comprising measuring the indentation of a surface of the lithium ion battery with a durometer measuring device.

In another embodiment, there is provided a method and apparatus for determining the SoC and SoH of a lithium ion battery, comprising measuring the effective density of the lithium ion battery.

In another embodiment, there is provided a method and apparatus for determining the SoC and SoH of a lithium ion battery, comprising measuring absorption and transmission spectra of X-rays transmitted into the lithium ion battery.

In another embodiment, there is provided a method and apparatus for disrupting the SSEI layer of a lithium ion battery, comprising at least one ultrasound transducer configured to transmit at least one ultrasound wave at a resonant frequency into the lithium ion battery to disrupt the SSEI layer. The at least one ultrasound wave may be transmitted to the anode/cathode of the lithium ion battery or the SSEI layer of the lithium ion battery.

In another embodiment, there is provided a method and apparatus for disrupting the SSEI layer of a lithium ion battery, comprising introducing high intensity ultrasound to induce cavitation in the lithium ion battery to disrupt the SSEI layer.

In another embodiment, there is provided a method and apparatus for disrupting the SSEI layer of a lithium ion battery, comprising introducing high intensity ultrasound to excite various resonant structures of the lithium ion battery to cause a strong mechanical response in the anode/cathode in order to disrupt the SSEI layer.

In another embodiment, there is provided a method and apparatus for disrupting the SSEI layer of a lithium ion battery, comprising at least one phased array of ultrasound transducers configured to transmit ultrasound waves to constructively interfere in the lithium ion battery to disrupt the SSEI layer.

In another embodiment, there is provided a method and apparatus for disrupting the SSEI layer of a lithium ion battery, comprising irradiating the SSEI layer with X-rays, wherein the energy of the X-rays is absorbed into bonds of organic material in the SSEI layer.

In another embodiment, there is provided a method and apparatus for disrupting the SSEI layer of a lithium ion battery, comprising an alternating current source configured to supply alternating current to the lithium ion battery to disrupt the SSEI layer.

In another embodiment, there is provided a method and apparatus for disrupting the SSEI layer of a lithium ion battery, comprising circuitry configured to create a low impedance condition similar to a controlled to short circuit the lithium ion battery to disrupt the SSEI layer.

In another embodiment, there is provided a method and apparatus for disrupting the SSEI layer of a lithium ion battery, comprising a rocker configured to rock the lithium ion battery about a pivot point in order to generate a squeeze film to disrupt the SSEI layer.

In another embodiment, there is provided a method and apparatus for disrupting the SSEI layer of a lithium ion battery, comprising generating centrifuge-induced surface shear stresses in order to disrupt the SSEI layer.

In another embodiment, there is provided a method and apparatus for disrupting the SSEI layer of a lithium ion battery, comprising at least one ultrasound transducer configured to generate high velocity acoustic streaming between the anode and cathode of the lithium ion battery in order to disrupt the SSEI layer.

In another embodiment, there is provided a method and apparatus for disrupting the SSEI layer of a lithium ion battery, comprising controlling the environment of the battery in order to affect and disrupt the bonds of the SSEI layer.

In another embodiment, there is provided a method and apparatus for disrupting the SSEI layer of a lithium ion battery, comprising utilizing impulse forces (e.g., thermal, mechanical, and/or electrical) in order to disrupt the SSEI layer.

In another embodiment, there is provided a method and apparatus for treating a lithium ion battery, wherein treating the lithium ion battery comprises determining the SoC and SoH of the lithium ion battery and disrupting the SSEI layer of the lithium ion battery.

DETAILED DESCRIPTION

Figure 1:
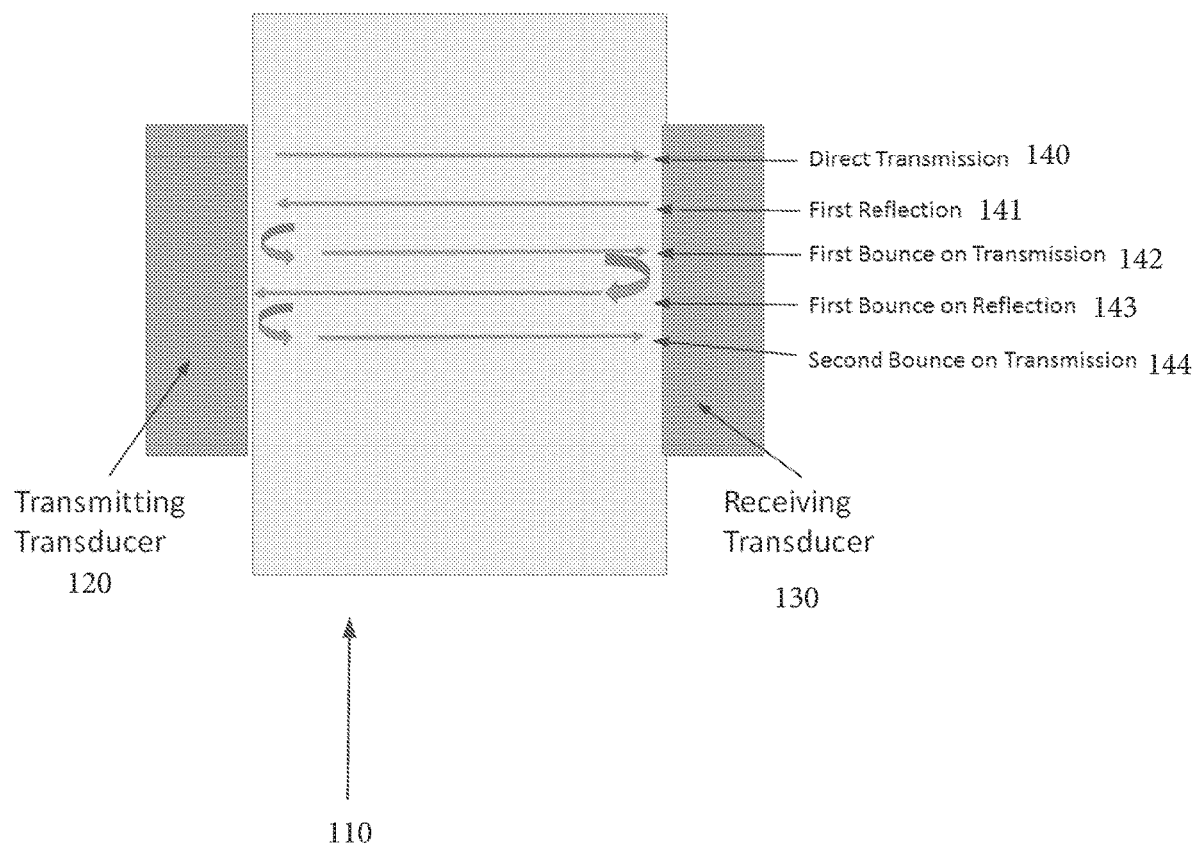
FIG. 1 illustrates an embodiment of a system in which ultrasound transducers are utilized to determine the SoC and SoH of a lithium ion battery.

As the demand for digital and renewable technologies supplants carbon-based and analog/mechanical/manual technologies, reliance on electron energy storage (stationary and portable) is becoming paramount for the modern world to operate. For the past eighty years, electron energy storage has been used in hybrid systems but, in the last decade, it has evolved to become the main system for all energy storage. This evolution was led by the rapid emergence and adoption of mobile devices (e.g., cell phones and laptops), and now electron energy storage continues to grow into the transportation and industrial industries. Technologically, this shift was enabled by the lower cost of components and the high energy density of lithium ion batteries, and in particular by the NMC (LiNiMnCo) structure. As the transportation and industrial storage industries move toward renewable systems to benefit from high volumetric and gravimetric energy density, high rate capability, low calendric aging, thermal stability, and a declining cost, the reliance on lithium ion batteries becomes essential. There are several lithium ion battery chemistries, but the leading chemistries are based around NMC architecture. The benefits of this architecture come with a cost, primarily in capacity fade through normal usage, thus making batteries a consumable system. The other inherent problem of all lithium ion battery systems, as well as all battery systems, is that it is expensive and difficult to determine the real and accurate State of Charge (instantaneous amount of charge stored as a fraction of the battery's present full capacity, SoC) and State of Health (remaining battery's present capacity as a fraction of its original capacity cycle life, SoH. SoH is related to end-of-life assessment). These two drawbacks of the lithium ion battery system have slowed down universal and wholesale adoption of lithium ion batteries as an energy storage system. Some limitations of lithium ion battery operation are as follows:

a). There may be no economic and feasible means to accurately assess SoH or SoC during normal operation b). Current means to assess end-of-life capacity may be expensive and cumbersome c). Due to inaccuracies in conventional battery management systems (BMS), overly conservative limitations on battery operation ranges to guard against overcharging and undercharging may be enforced such that only 60-70% of the total capacity of the battery may be made available to users d). Large battery farms may need high level precision and control (at both the module and cell level) in order to uniformly age the total system consisting of units with mismatched voltages and capacities The daily operation of battery systems requires accurate, real-time knowledge of SoC to maximize system capacity over the entire range of charge. Current BMS are inaccurate and employ a combination of an empirical estimation, known as coulomb counting, and resistance and temperature measurements. Due to this inaccuracy (of about 4%), current BMS restrict the operating envelope of the battery to a smaller portion of the total capacity, typically 60-70% of the actual range. This limitation is purposely designed to avoid safety limits, which could result in damaging the battery in a variety of ways.

The end-of-life assessment to determine the remaining capacity of a battery is quantified by the SoH. The conventional SoH determination process is expensive (high end electronic equipment) and very time consuming (8-12 hours). Thus, many batteries are discarded and recycled instead of being reused to capture their remaining economic value.

Lithium ion batteries are made of chemical compounds called interstitial compounds. The cathode of the battery may be, but is not limited to, a transition metal oxide (e.g., Nickel Manganese Cobalt Oxide, Lithium Manganese Oxide, and Lithium Iron Phosphate). The anode of the battery may be, but is not limited to, single layers of graphite (graphene).

In normal operating conditions, lithium ion batteries may degrade at different rates through many operating cycles. This may be due to environmental conditions, manufacturing irregularities, variability in user usage of the batteries, among other conditions. Thus, the ability to accurately determine the true state of a battery may be difficult as no two batteries are exactly alike. Current battery management systems are unable to account for these variations, and, coupled with measurement inaccuracies, continue accumulating and compounding errors in measuring a battery's state.

The ability to accurately assess the condition of a lithium ion battery may be important to predict the performance and degradation of the battery and, ultimately, to extend the lifetime of the battery. Battery performance may be described by two performance metrics: a State of Charge (SoC) and a State of Health (SoH).

SoC may be defined as the ratio of instantaneous charge stored in the present battery cycle to total usable capacity of the present cycle. For example, during a discharge cycle:

$$SoC = 1 - \int \frac{i\,dt}{C_n},$$

wherein i(t) is instantaneous discharge current over time and $C_n$ is the total usable capacity of the current cycle. The integral may be taken from the beginning of the discharge cycle to the present time. Alternatively, nominal capacity of the battery (factory original capacity) may be used for $C_n$ instead as the current capacity may not be known. The nominal capacity is given by the manufacturer and represents the maximum amount of charge that can be stored in the battery. Thus, a battery's SoH(t) may be defined as the ratio of its current total capacity at time t, or Q(t), to the nominal factory original capacity $Q_n$:

$$SoH(t) = \frac{Q(t)}{Q_n}.$$

A battery's SoH may also be defined as the ratio of total usable capacity of the battery's current cycle to total usable capacity of the battery's initial cycle.

Conventionally, a battery's SoC and SoH are determined through empirical relationships established through lab-based cycling of cells. These relationships may not account for environmental conditions and/or usage characteristics. These empirical relationships are the basis for BMS systems. Since they may not be accurate predictions of realistic use cases, the BMS systems tend to become inaccurate over time. For example, the uncertainty of SoH measurements can be as high as 40%. On the other hand, measurements of the mechanical, chemical, and/or physical properties as described herein can be correlated to SoC and SoH, and thus provide rapid and accurate measurements of a battery's SoC and SoH.

This inaccuracy and imprecision of conventional SoC and SoH measurement forces the current systems to impose overly conservative limits on battery usage in order to prevent damaging the battery. To do this, the range over which the battery is allowed to operate may be confined to avoid the extrema of the usable range, as conventional methodology is not precise enough to determine how close the battery is operating to the outer envelopes of otherwise safe regimes. Knowledge of a battery's SoC and SoH is essential for all current battery powered electronic systems as the two parameters define the operational envelope of the overall systems. The inventors have recognized and appreciated the need for a non-intrusive approach for accurately determining a battery's SoC and SoH, as this may enable optimal use of the battery by allowing users to exploit the battery's full range and potential.

In some embodiments, at least one ultrasonic transducer may be used to measure the transmission of an ultrasonic signal (e.g. a short pulse) through, and/or the reflection of energy from, a battery. Properties of these signals contain information that may allow for the measurement of chemical and mechanical states of the battery, which may be used to determine the SoC and SoH of the battery. The use of at least a first ultrasonic transducer to initiate the signal at a particular ultrasonic frequency (e.g., 1 MHz or less, although it should be appreciated that any ultrasonic frequency may be utilized) into the battery and the measurement of received signals by at least a second transducer (on the other side of the battery for through-transmission, or on the same side of the battery for wave reflected from the battery structures and/or its boundaries or surface waves) and at the first transducer (for reflection) may provide four general types of data: (1) Times of Flight (TOF) of the signals between the first and second transducers, or between leaving the first transducer and returning to the first transducer (for reflected signals); (2) Changes in amplitude and/or signal characteristics (e.g. waveform shape) as a result of propagation along various paths taken by the ultrasonic signal; (3) Phase change of the received signals relative to the original transmitted signal. Each of these four areas of data may be due to chemical and/or mechanical changes within the battery.

These measurements, individually or in combination, may provide information required to determine the changes of state of the battery, such as chemical changes related to transport of ions into the anode, where these quantities may be function of, for example, density, bulk, shear, and related moduli, and/or wave speed of ultrasonic or sonic (audio frequency) waves. These quantities may be a function of temperature and pressure applied to the transducers. These measurements may allow for rapid determination of the battery's SoC and SoH. Single or multiple transducers and frequencies may be used in the forms of tone bursts or more broadband signals, e.g. chirps. Repeated measurements of these quantities on several batteries or the same battery over time may be used to create a reference data set and/or establish a quantitative analytic functional correlation between these measurements and the SoC and SoH. The reference data set and/or the quantitative analytic functional correlation may be used to derive SoC and SoH from future measurements.

With adequate energy in a transmitted ultrasound pulse, higher order signals (i.e. bounces) can be captured in addition to the through transmitted and reflected signals. For example, when two transducers on opposite sides of a battery are used, a "first" bounce consists of a signal transmitted from a first transducer across the battery, reflected back across the battery from the second transducer to the first transducer, reflected back from the first transducer, and received by the second transducer. This signal will have crossed the battery three times. Higher order bounces can be observed by both ultrasonic transducers. These signals will have passed through the battery multiple times, and may be modified by these passages more strongly than the direct signals and may contain more information about the battery states.

For example, FIG. 1 illustrates an embodiment of a system 100 in which ultrasound transducers are utilized to determine the SoC and SoH of a lithium ion battery. The system 100 may include at least a battery 110, a transmitting transducer 120, and a receiving transducer 130. The transmitting transducer 120 may be configured to transmit at least one ultrasound wave, for example a direct transmission wave 140, into the battery 110. The receiving transducer 130 may be configured to receive and measure the direct transmission wave 140. The battery may reflect the ultrasound wave transmitted by the transmitting transducer 120. The reflected wave may be a first reflection wave 141, for example, and the transmitting transducer 120 may be configured to receive and measure the first reflection wave 141. The ultrasound wave may continue to pass through and be reflected by the battery, and there may be at least a first bounce on transmission wave 142, a first bounce on reflection wave 143, and a second bounce on transmission wave 144, and further bounces. The transmitting transducer 120 and receiving transducer 130 may be configured to receive and measure these waves. As discussed, the various waves (e.g. the direct transmission wave 140, the first reflection wave 141, the first bounce on transmission wave 142, the first bounce on reflection wave 143, and the second bounce on transmission wave 144) may have been uniquely modified by passing through the battery a varied number of times. By measuring these waves, the SoC and SoH of the battery 110 may be determined.

In another embodiment, at least one accelerometer and/or at least one strain gauge may be used to measure vibrations, accelerations, and any other motions induced by an external mechanical source in order to determine the SoC and SoH of a battery. Accelerometers may be designed to operate for a variety of conditions and to measure a broad range of accelerations, from very low accelerations (e.g., nano G's) to very high accelerations (e.g., 50K G). In such an embodiment, the at least one accelerometer and/or the at least one strain gauge or an electro-optic sensor (e.g. a Laser Doppler velocimeter or a fiber-optic interferometric accelerometer) may be used to measure a vibrational response to a calibrated force input on a battery, for example an instrumented hammer.

Mechanical properties of a battery may be processed to provide information on the battery's SoC and SoH. These mechanical properties may be probed by measuring, with the at least one accelerometer, the at least one strain gauge, and/or at least one electro-optic sensor the vibrational response to a known mechanical excitation. An excitation device may be one of several means, for example an electromagnetic shaker, an instrumented hammer, a calibrated spring-loaded impulsive probe (which may include an electromechanical trigger), ambient noise generated by environmental conditions around the battery (e.g. acoustic or ultrasonic tones generated by a cell phone), an acoustic or ultrasonic transducer, or any other means for excitation. The frequency at which excitation takes place may range from approximately 10 Hz to as high as multiple MHz. An excitation signal may be either narrowband or broadband, and its waveform may be shaped to optimize a predetermined processing methodology. The excitation device, the at least one accelerometer, the at least one strain gauge, and/or the at least one electro-optic sensor may be placed at one or more positions on the battery simultaneously or sequentially. At least one output from the at least one accelerometer, the at least one strain gauge, and/or the at least one electro-optic sensor may be combined to form a group which may be processed to form directional beams with which to probe specific depths within the battery or its surfaces. With the application of an initial known force, the at least one output from the at least one accelerometer, the at least one strain gauge, and/or the at least one electro-optic sensor may be measured to determine mechanical and/or physical properties of the battery. These properties may then be correlated to the SoC and SoH of the battery. Specifically, there may be three ways to analyze the at least one output from the at least one accelerometer and the at least one strain gauge.

First, a time of flight from excitation source to the one or more accelerometers, the one or more strain gauges, and/or the at least one electro-optic sensor may be measured. Additionally, the difference between a time of arrival of the excitation signal between different accelerometers, strain gauges, and/or electro-optic sensors may be measured. These times may provide sensitive measures of the speed of sound within the battery and the effective mechanical moduli and density, which may provide sensitive measures of the SoC and the SoH of the battery. These times may be computed by various methods, including measurements of arrival times of features (e.g. peaks) in waveforms, cross-correlation techniques, wavelet analysis to identify the times of arrival of various frequency components at the at least one accelerometer, the at least one strain gauge, and/or the at least one electro-optical sensor and replica processing that may identify a particular known signal shape under high and low signal-to-noise ratios. The signals may not need to be adequately short-lived to remain separated in time as may be more commonly achieved with high frequency ultrasonic methods.

Second, signal shape evolution may be measured. Signals obtained by at least one vibration sensing device may be deformed due to the signal's propagation through the battery. As a result, the signal's amplitude, shape, and phase may vary. These changes in the signal, which are functions of the battery's SoC and SoH, may be quantified with cross correlation, wavelet analysis, and/or replica processing.

Third, an accelerance, defined as the ratio of the known force input or its Fourier transform to the measured acceleration (or its Fourier transform), may be measured. This ratio may be measured with the at least one accelerometer in close proximity to the point of excitation, and may be a measure of the input impedance of the surface of the battery, as well as other surface and internal characteristics.

Figure 2:
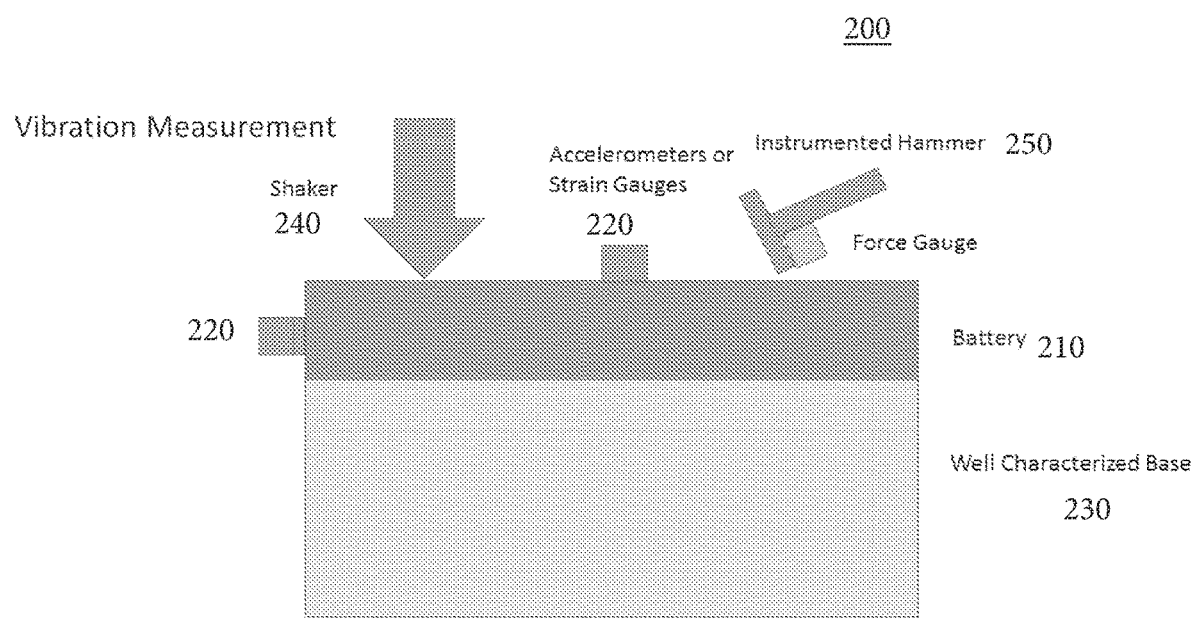
FIG. 2 illustrates an embodiment of a system in which accelerometers and strain gauges are utilized to measure various motions of the battery in order to determine the SoC and SoH of a lithium ion battery

For example, FIG. 2 illustrates an embodiment of a system 200 in which accelerometers, strain gauges, and/or at least one electro-optic sensor are utilized to measure various induced motions of the battery in order to determine the SoC and SoH of a lithium ion battery. The system 200 may include at least a battery 210, at least one accelerometer, strain gauge, and/or electro-optic sensor 220, a base 230, a shaker 240, and an instrumented hammer 250. The battery 210 may be configured to be mounted onto the base 230. In some embodiments, the shaker 240 may be configured to shake the battery 210, and the instrumented hammer 250 may be configured to strike the battery 210. The at least one accelerometer or strain gauge 220 may be configured to measure motion of the battery 210 in response to being shaken by the shaker 240 and/or struck by the instrumented hammer 250. These measurements of motion may be functions of the SoC and SoH of the battery 210, and thus the SoC and SoH of the battery 210 may be determined.

In another embodiment, acoustic illumination may be utilized as an excitation force on a lithium ion battery. The acoustic illumination may be utilized as an excitation force on the lithium ion battery at an arbitrary angle of incidence. This measurement may be made with the battery in air, or with the battery submerged in another medium with appropriate acoustic properties (e.g. water). In such an embodiment, motion at the surface of the battery may respond according to the moduli and arrangement of the battery's internal components (e.g., the anode and cathode). The response of the surface of incidence or other mechanical features (e.g., the vibratory response of the opposite side of the battery) may be measured by at least one accelerometer, laser vibrometer, poled PVDF (Polyvinyldene Fluoride) strain gauges or accelerometers, thickness gauges, conventional strain gauges, and/or electro-optic sensors at one or more positions on the battery. Acoustic stimuli may include continuous wave signals, tone bursts, chirps, broadband noise, and/or impulses "broadcasted" by at least one speaker or by at least one transducer or one vibrometer (shaker) capable of transmitting an acoustic or ultrasonic wave to the battery surface. The vibratory response may be composed of a wave reflected from the front surface of the battery, from structures within the battery, and from the back surface of the battery. With adequately short pulses, these components may arrive at a receiver at different times, which may provide information about the various structures of the battery. Frequencies may range from approximately 10 Hz to as high as multiple MHz.

Acoustic waves reflected by and/or transmitted through the battery into a surrounding acoustic medium (e.g. air or water) and received on the side of incidence and/or the opposite side of the battery may also be measured by a microphone, or a steerable array of microphones or, if underwater, hydrophones, to provide information relating to mechanical properties of the battery and its SoC and SoH.

For incident signals of adequate temporal extent, the measured vibration and/or the reflected and transmitted waves from the battery may reach a steady state condition wherein all components (e.g., front surface of the battery, structures within the battery, and back surface of the battery) continuously contribute (by reflection, as well as transmission through both the boundary of the battery and through internal layers of the batter) to the measured signal. Both transient and steady state responses may be sensitive to the relative amplitudes and phases of each component. Each component may be a function of the dynamic moduli of its constitutive parts and the thickness and position within the battery, and may contain information that may relate to the battery's SoC and SoH. Sensors may be used individually or formed into steerable arrays to isolate responses from various depths within the battery.

Figure 3:
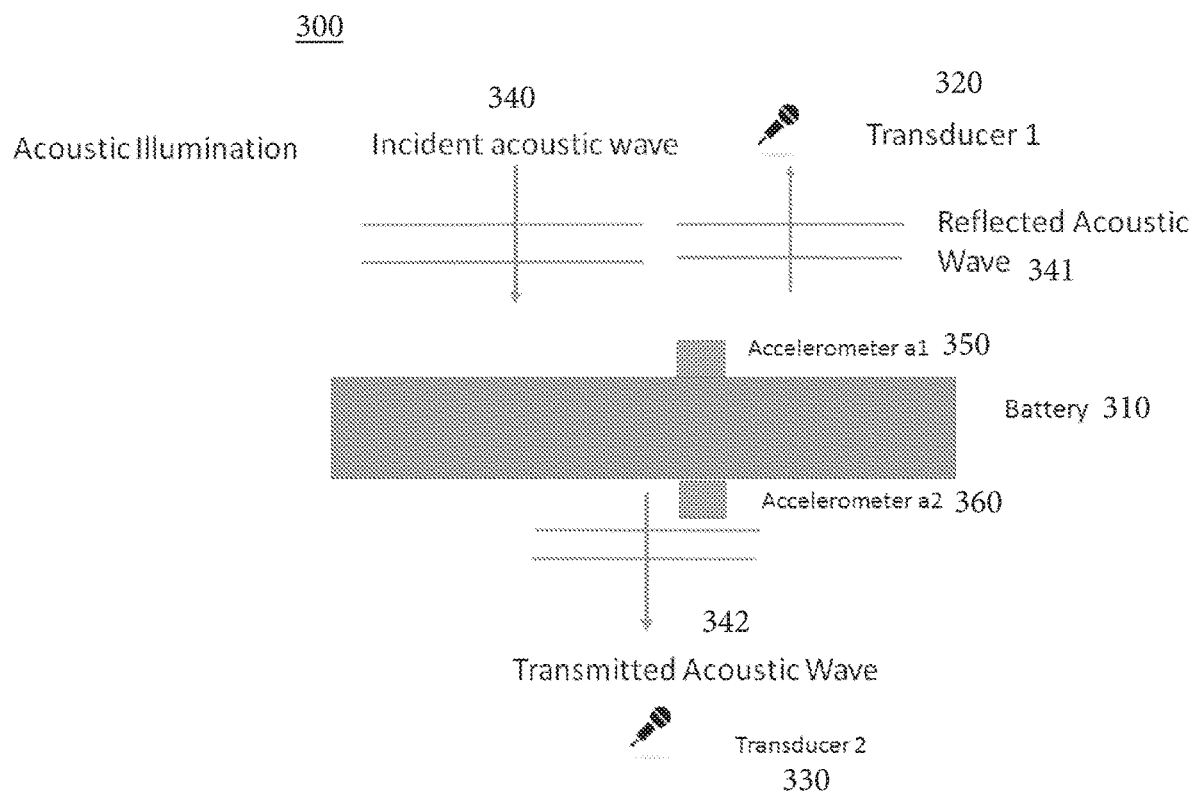
FIG. 3 illustrates an embodiment of a system in which acoustic illumination may be utilized to determine the SoC and SoH of a lithium ion battery

For example, FIG. 3 illustrates an embodiment of a system 300 in which acoustic illumination may be utilized to measure the SoC and SoH of a lithium ion battery. The system 300 may include at least a battery 310, a first transducer 320 (e.g. an ultrasonic transducer), a second transducer 330, a first accelerometer or vibration sensor 350, and a second accelerometer or vibration sensor 360. The first transducer 320, or an external speaker, may transmit an incident acoustic wave 340 to the battery, which may partially reflected from the battery 310 as an acoustic wave 341, and may partially transmit through the battery 310 as a transmitted acoustic wave 342. The first transducer 320 may be configured to receive the reflected acoustic wave 341, and the second transducer 330 may be configured to receive the transmitted acoustic wave 342. As discussed, the surface of the battery 310 may react to the excitation of the acoustic waves. The first accelerometer or vibration sensor 350 may be configured to measure the movement, due to the acoustic waves, of the surface of the battery 310 on the same side as the first transducer 320. The second accelerometer or vibration sensor 360 may be configured to measure the movement, due to the acoustic waves, of the surface of the battery 310 on the same side as the second transducer 330. In doing so, the SoC and SoH of the battery 310 may be determined.

In another embodiment, the battery may be mounted, on one side, atop a vibrating bed (e.g., a shaker), and the battery's vibrational response is measured. This method may measure the ratio between the acceleration on the two sides of the battery. This may provide a measurement of the dynamic compressional modulus that may be a function of the battery's SoC and SoH. In one embodiment, at least one additional mass may be mounted on the side of the battery opposite the shaker. A variety of appropriately selected masses may be placed on the side of the battery opposite the shaker, and may create "spring-mass" resonances which may produce a peak response at the resonant frequencies (which may occur in the audio range) determined by the stiffness and mass of the battery. This may provide the dynamic compressive modulus and loss factor of the battery as a function of frequency. If there is significant loss associated with the modulus, these frequencies may be functions of temperature. This way, measurements may be taken over a range of temperatures, which may provide additional information on the state of the battery. The motion of the battery may be measured by accelerometers, strain gauges, laser velocimetry, or with other appropriate means.

Figure 4:
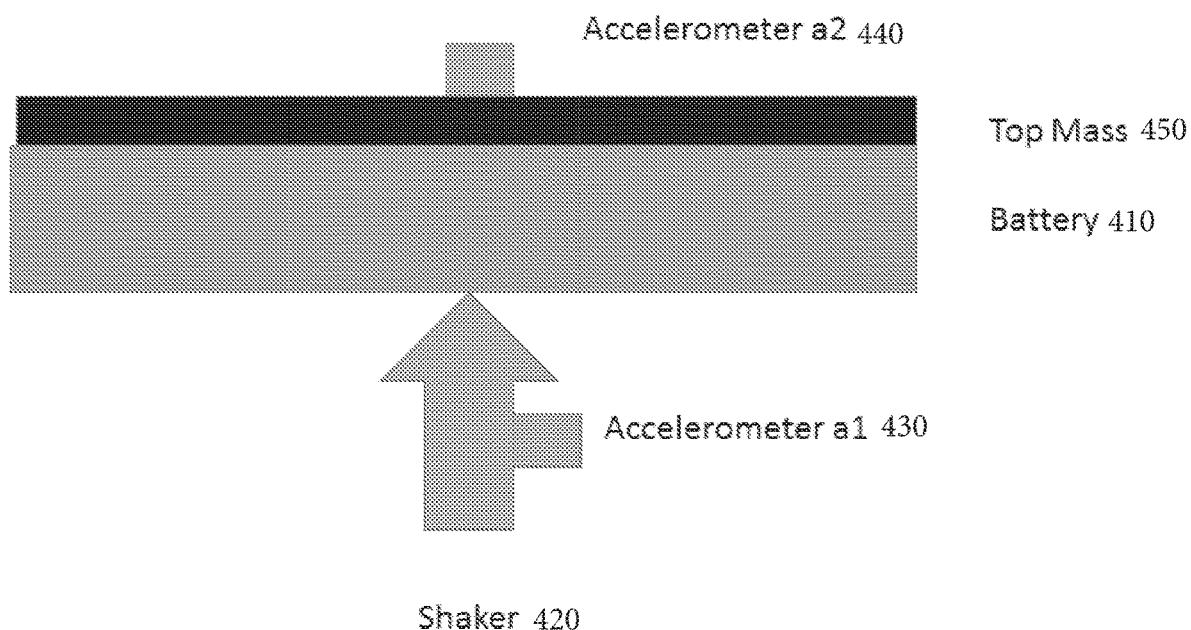
FIG. 4 illustrates an embodiment of a system in which a shaker may be utilized to determine the SoC and SoH of a lithium ion battery.

For example, FIG. 4 illustrates an embodiment of a system 400 in which a vibrometer or shaker may be utilized to measure the SoC and SoH of a lithium ion battery. The system 400 may include at least a battery 410, a vibrometer or shaker 420, a first accelerometer or other vibration sensor 430 on the shaker 420 or on the battery 410 next to the shaker 420, and a second accelerometer or other vibration sensor 440 on the battery 410 or on top of a top mass 450. The battery 410 may be mounted, by a first side of the battery 410 (the side closer to the first accelerometer 430), on the shaker 420. The shaker 420 may be configured to shake the battery 410. The first accelerometer or vibration sensor 430 may be configured to measure the vibration, at the first side of the battery 410, due to the shaking. The second accelerometer or vibration sensor 440 may be configured to measure the vibration, at a second side of the battery 410 (the side closer to the second accelerometer 440), due to the shaking. In some embodiments, the top mass 450 may be coupled to the second side of the battery 410. As discussed, measuring the movement of the battery 410 due to the shaking may aid in determining the SoC and SoH of the battery 410.

Each of the aforementioned methods using transmission vibration resonance information to determine the SoC and SoH of a battery may be used individually or in any combination. In some embodiments, external pressure, external temperature, humidity, and/or atmospheric conditions may be varied to enhance the accuracy of the measurements. These external factors may influence the static and dynamic moduli of the battery. Taking measurements while varying these external factors may establish a wide reference dataset, which may enhance the accuracy of SoC and SoC determination.

In another embodiment, the SoC and SoH of a battery may be determined by measuring the bending stiffness of the battery. One of the most prominent mechanical changes that a battery may undergo as its SoC and SoH change is its stiffness. This may manifest as a palpable change in the bending modulus of the battery. A battery's stiffness may also be affected by the battery's internal temperature and pressure. The battery's bending modulus may be measured by mounting the battery by the ends of the battery, and measuring the deflection between the mounting points in response to a known quantity of force in a direction perpendicular to the plane of the battery. This measurement may be static (e.g., by applying a constant force) or dynamic (e.g., by applying a harmonic force). Static and dynamic deflection may be measured with numerous instruments, such as with LVDT (Linear Variable Differential Transformer) displacement sensors, strain gauges, accelerometers, electro-optic sensors, or other appropriate means. In measuring the deflection of the battery and determining the battery's bending modulus, the battery's SoC and SoH may be determined.

Figure 5:
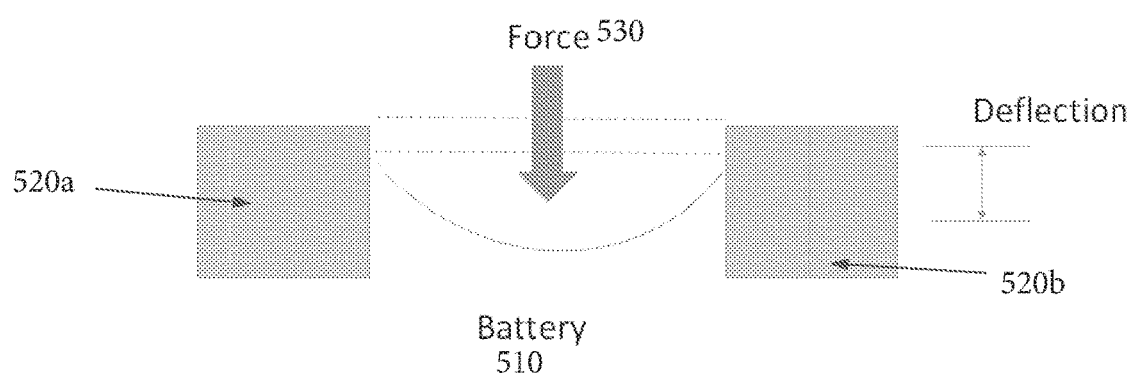
FIG. 5 illustrates an embodiment of a system in which the bending modulus may be measured to determine the SoC and SoH of a lithium ion battery.

For example, FIG. 5 illustrates an embodiment of a system 500 in which the bending modulus may be measured to determine the SoC and SoH of a lithium ion battery. The system 500 may include at least a battery 510, mountings 520a and 520b, and an external force 530. The battery 510 may be mounted by its ends with the mountings 520a and 520b. The external force 530 may be applied in a direction perpendicular to the plane of the battery 510, and may cause the battery to deflect in the direction perpendicular to the plane of the battery 510. This deflection may be measured in order to calculate the bending modulus of the battery 510, and thus to determine the SoC and SoH of the battery 510.

In another embodiment, the SoC and SoH of a battery may be determined by measuring the compressibility of the battery. As previously discussed, a battery's bending modulus may change through the battery's lifetime. Another modulus that may similarly be affected is the battery's compressibility. The battery's compressibility may also be affected by the battery's internal temperature and pressure. In some embodiments, an instrument (e.g., an Instron) may measure the compression of the battery for a given amount of compressive force. From the deflection, the battery's compressibility modulus may be derived, and the battery's SoC and SoH may be determined.

Figure 6:
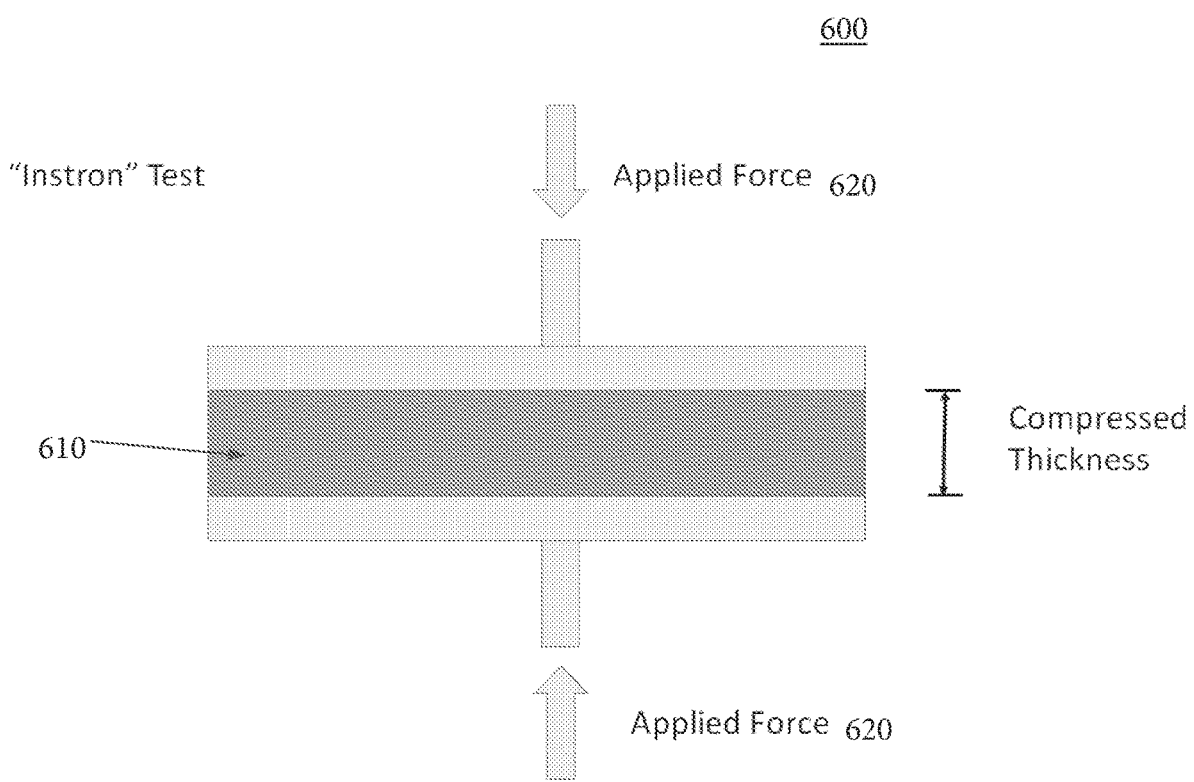
FIG. 6 illustrates an embodiment of a system in which the compressibility modulus may be measured to determine the SoC and SoH of a lithium ion battery.

For example, FIG. 6 illustrates an embodiment of a system 600 in which the compressibility modulus may be measured to determine the SoC and SoH of a lithium ion battery. The system 600 may include at least a battery 610 and applied forces 620. The applied forces 620 may be applied to opposite sides of the battery 610 in order compress the battery 610. In another embodiment, the battery 610 may be placed on a rigid surface with a compressive force applied on its opposite side. The battery 610, due to the applied forces 620, may compress to a thickness smaller than the regular thickness of the battery 610 (the thickness of the battery 610 under no applied forces). The compressed thickness may be measured, and the compressibility modulus of the battery 610 may be calculated. Thus, the SoC and SoH of the battery 610 may be determined.

In another embodiment, the SoC and SoH of a battery may be determined by measuring the thickness of the battery. Due to intercalation of the lithium ions into the crystal structure of the anode of the battery, a significant change may be seen in the lattice parameters of the crystal. This may produce a significant expansion and/or contraction of the crystal depending on the presence and density of lithium ions within the crystal structure. This effect may manifest as a change in thickness of the battery, wherein the amplitude of the effect may be limited by the degree of constraint on the battery due to, for example, the packaging of the battery. By measuring and characterizing the change in thickness of the battery at different, known SoC and SoH, a reference dataset may be established, which may allow for accurate future determinations of SoC and SoH by measuring the change in thickness of a battery. To determine the change in thickness of a battery, at least one strain gauge (e.g., an LVDT sensor, a PVDF strain gauge, a PZT (piezoceramic) strain gauge, or a fiber optic strain gauge) may be implemented, however the present invention is not so limited. The at least one strain gauge may be placed on the outer packaging of the battery pack, or on individual cells. In an embodiment where a fiber optic strain gauge is implemented, the fiber optic strain gauge may comprise a fiber attached to the outer boundary of a battery or its cells, and the strain may be measured with an interferometer.

In another embodiment, a durometer instrument may be implemented to measure the static modulus of a battery at its surface. In such an embodiment, the durometer instrument may consist of a pointed indenter which may be pressed into the battery to cause an indent in the surface of the battery, and a gauge that measures the depth of the indentation. The depth of the indentation may be a function of the static modulus of the surface of the battery, and may change due to mechanical, chemical, and/or physical changes within the battery. By measuring the depth of the indentation into the surface of the battery at different, known SoC and SoH, a reference dataset may be established, which may allow for accurate future determinations of SoC and SoH by measuring the depth of the indentation into the surface of the battery.

Figure 7:
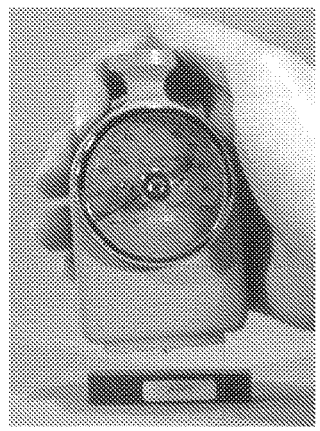
FIG. 7 illustrates an embodiment of a system in which the static modulus of a surface of a lithium ion battery may be measured to determine its SoC and SoH.
Figure 7:
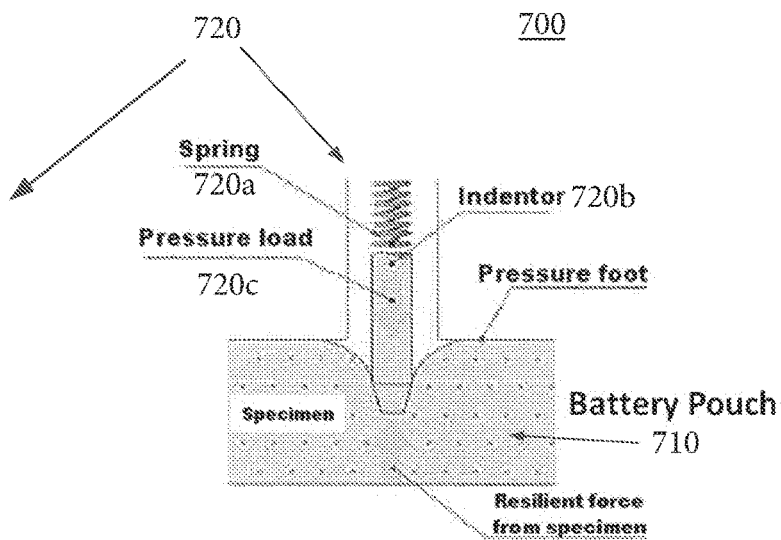

For example, FIG. 7 illustrates an embodiment of a system 700 in which the static modulus of a battery is measured in terms of the battery's surface deformation to determine its SoC and SoH. The system 700 may include a battery 710 and a durometer instrument 720, which may comprise a spring 720a, an indentor 720b, and a pressure load 720c. The durometer instrument 720 may be configured to indent the surface of the battery 710. The durometer instrument 720 may be further configured to measure the depth of the indentation into the surface of the battery 710. As discussed, the indentation may correspond to the SoC and SoH of the battery 710. Thus, by measuring the depth of the indentation, the SoC and SoH of the battery 710 may be determined.

In another embodiment, the battery may be placed in a fluid of known volume, mass, and density, and the amount of fluid displaced may be measured. As the SoC and SoH of a lithium ion battery change, the dimensions and the density of the battery may also change. When the battery is placed in the fluid, the amount of fluid displaced may be proportional to the density of the battery. This measurement of density may be used to accurately determine the SoC and SoH of the battery.

Figure 8:
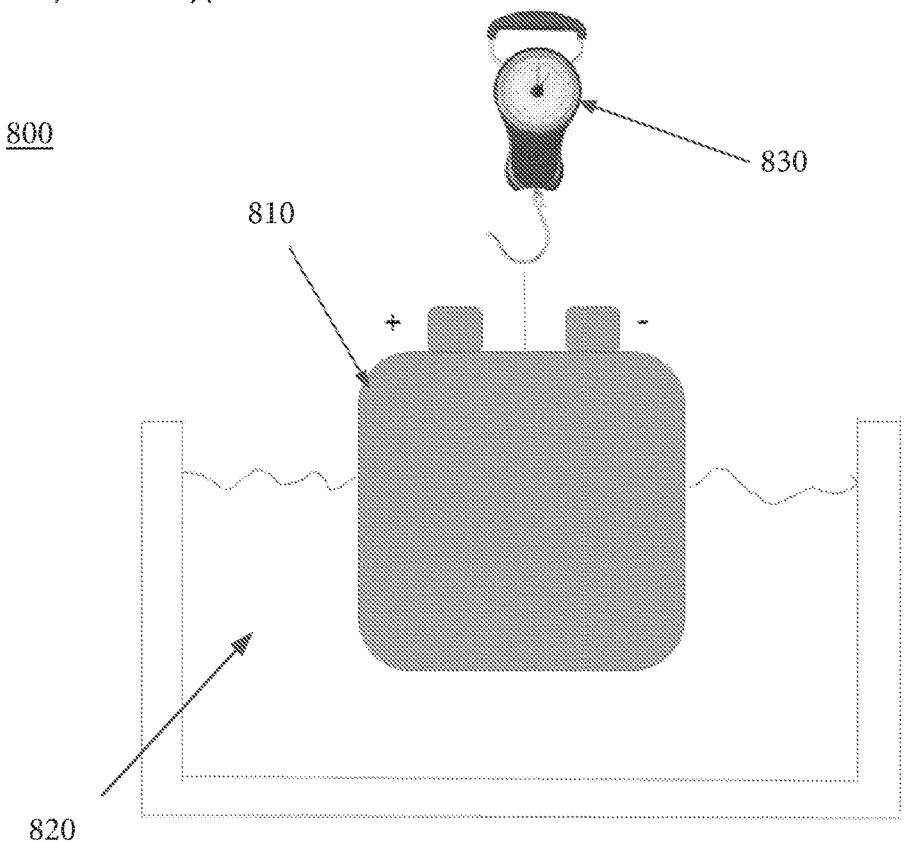
FIG. 8 illustrates an embodiment of a system in which the density of a lithium ion battery may be measured to determine its SoC and SoH.

For example, FIG. 8 illustrates an embodiment of a system 800 in which the density of a lithium ion battery may be measured to determine its SoC and SoH. The system 800 may include at least a battery 810, a fluid 820, and a scale 830. The scale 830 may be configured to measure the submerged weight, and thus the mean density, of the battery 810. The battery 810 may be placed into the fluid 820, and the amount of fluid 820 displaced by the battery 810 may be measured. Thus, having measured the mass and volume of the battery 810, the density of the battery 810 may be determined. Thus, the battery's SoC and SoH may be determined.

In another embodiment, X-rays may be used to characterize the density of materials within the battery and their crystal structures. By measuring changes to the density within a battery at different SoC and SoH, a reference dataset may be established, which may allow for accurate future determinations of SoC and SoH by measuring the change in density within a battery using X-rays. X-rays may be used in a transmission, absorption, and/or back scatter mode either separately or in combination with each other as well as with other techniques.

Figure 9:
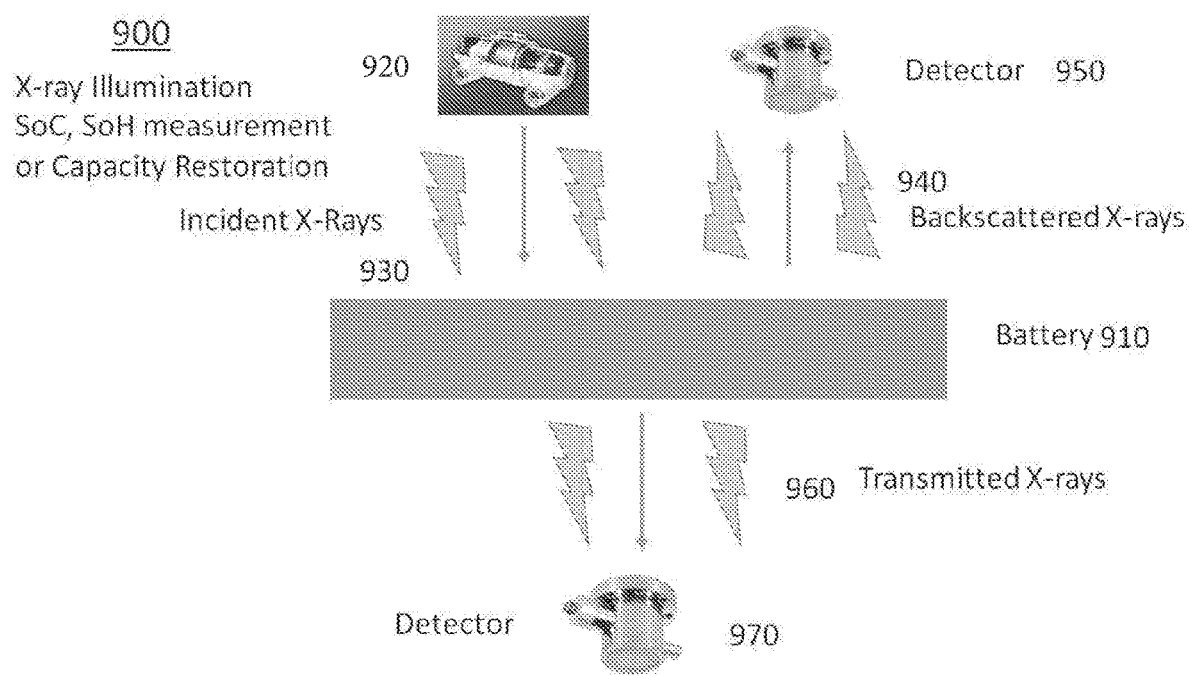
FIG. 9 illustrates an embodiment of a system in which X-rays are utilized to determine the SoC and SoH of a lithium ion battery.

For example, FIG. 9 illustrates an embodiment of a system 900 in which X-rays may be utilized to determine a battery's SoC and SoH. The system 900 may include a battery 910, a plurality of X-ray sources 920, at least one first detector 950, and at least one second detector 970. The plurality of X-ray sources 920 may be configured to emit X-rays, for example incident X-rays 930. The emitted X-rays may partially pass through the battery 910, for example with transmitted X-rays 960, and also partially reflect off the battery 910, for example with backscattered X-rays 940. The at least one first detector 970 may be configured to receive and measure the transmitted X-rays 960. The at least one second detector 950 may be configured to receive and measure the backscattered x-rays 940. The spectra of the emitted X-rays may be modified by reflecting off and transmitting through the battery 910, and thus the spectra of the backscattered X-rays 640 and the transmitted X-rays 960 may vary. By measuring the spectra of the backscattered X-rays 640 and the transmitted X-rays 960, the SoC and SoH of the battery 910 may be determined.

Described herein are various methods of determining the SoC and SoH of a lithium ion battery. It should be appreciated that each of these methods may be used individually, or in any combination, in order to accurately determine the SoC and SoH of the battery.

In addition to the SoC and SoH, another measure of battery state is the SoE (State of Energy), which may be a measure of the total energy stored in the battery. Calculated by the integral of the product of charging/discharging current and instantaneous voltage, the SoE is a direct measure of the work that can be extracted from the battery. It may be more closely related to, for example, the number of miles that can be driven with car using the battery, with the battery at a given charged state. While embodiments as described herein relate to measuring a battery's SoC and SoH, it should be appreciated that any of the embodiments as described may be used to measure the battery's SoE as well.

Lithium ion batteries fail for many reasons, but the most dominant reason for end of life may be a drastic reduction of capacity. This reduction of capacity, also known as capacity fade, is inherent with every lithium ion battery chemistry. In the late 1990's, the primary cause of capacity fade and capacity loss was discovered as the buildup of a Secondary Solid Electrolyte Interphase (SSEI) layer in the battery. During normal operation cycles of a lithium ion battery, the SSEI layer is formed atop the usual Solid Electrolyte Interphase (SEI) layer and on the anode particles due to electrolyte dissociation and impurities during assembly. As the battery cycles and thermal variation occurs, new molecules may form on the SSEI layer. Due to ion transport characteristics of the battery, the new molecules may migrate and form an increasingly impermeable layer on the electrodes of the battery. This degradation may be measured by a decrease in the SoH of the battery.

The continuous formation of the SSEI layer and the intercalation and deintercalation of lithium ions within the crystal structure of the anode and cathode may cause changes to the mechanical, chemical, and physical properties of the battery. By measuring and quantifying either or all of these changes, performance metrics, including SoH, of the battery may be deduced.

The SSEI layer forms through normal battery use. It may range from 10 Angstroms to 1.5 micrometers thick, may form on the electrodes of the battery, and may grow progressively throughout the battery's life cycle. The use profile of the battery combined with external factors such as temperature may determine the rate of formation of the SSEI layer. There may be a direct correlation between high temperature and high C-rate use of the battery with higher growth of the SSEI layer (C-rate refers to the ratio of current drawn during charge/discharge to the total capacity of the battery). As the SSEI layer increases in thickness, it may cause a degrading level of efficiency of the lithium ions' ability to traverse the active materials sites (i.e., to enter or exit the anode or cathode) to complete necessary electrochemical reactions, and may also prevent the battery from charging/discharging completely.

The SSEI layer may be composed of complex, long chain hydrocarbons and inorganic salts such as $Li_2CO_3$ (lithium carbonate), $Li_2O$ (lithium oxide), LiF (lithium fluoride), $LiOCO_2CH_3$ (lithium methyl carbonate), $LiOCO_2C_2H_5$ (lithium ethyl carbonate), $(CH_2OCO_2Li)_2$ (dilithium ethylene dicarbonate), and $(-CH_2-CH_2-O-)_n$ (polyethylene oxide). As these compounds are mildly polar, a dipole moment may exist within the compounds.

There may be three general intermolecular forces in the SSEI layer: Keesom force, Debye force, and London dispersion force. Each of the three may have different associated strengths, which may depend on the molecular structure of the SSEI layer. The following equation may describe how the contribution of the Keesom force within the SSEI layer may be calculated.

$$E = -\frac{(\alpha_{0,1}\mu_2^2 + \alpha_{0,1}\mu_1^2)}{(4\pi\varepsilon_0)^2 r^6}$$

In this equation, E is the energy of the intermolecular bond between two particles, $\mu_1$ and $\mu_2$ are dipole moments of the two particles, $\kappa$ is the Boltzmann constant, T is temperature, $\varepsilon$ is permittivity, and r is the distance between the two particles.

The following equation may describe how the contribution of the Debye force within the SSEI layer may be calculated.

$$E = -\frac{3h v_1 v_2 \alpha_{0,1} \alpha_{0,2}}{2(v_1 + v_2)(4\pi\varepsilon_0)^2 r^6}$$

In this equation, E is the energy of the intermolecular bond between the two particles, $\mu_1$ and $\mu_2$ are dipole moments of the two particles, $\alpha$ is polarizability, $\varepsilon$ is permittivity, and r is the distance between the two particles.

The following equation may describe how the contribution of the London dispersion force within the SSEI layer may be calculated.

$$E = -\frac{3h v_1 v_2 \alpha_{0,1} \alpha_{0,2}}{2(v_1 + v_2)(4\pi\varepsilon_0)^2 r^6}$$

In this equation, E is the energy of the intermolecular bond between the two particles, v is ionization potential, h is Planck's constant, $\alpha$ is polarizability, $\varepsilon$ is permittivity, and r is the distance between the two particles.

By calculating the energy of the bonds between particles in the SSEI layer, the total energy that must be induced into the bonds of the SSEI layer in order to disrupt the SSEI layer may be determined.

By determining the SoC and the SoH of a battery, the thickness of the SSEI layer and position of the ions within the battery may be determined. There may be a direct correlation between the SoC and SoH of a battery and the thickness of the SSEI layer. As discussed, the SSEI layer may inhibit the movement of lithium ions in and out of the crystal structure within the particles in the electrodes, essentially trapping ions within the crystal structure or preventing ions from accessing the crystal structure. This may increase strain on the battery, and may result in an increase in energy required to extract or push ions in the battery anode. Removal of the SSEI layer may enable the ions to migrate freely and restore the capacity of the battery.

A lithium ion battery may be considered dead when its capacity is 80% of its initial capacity. The non-intrusive approach for removing the SSEI layer of a lithium ion battery may restore the battery's capacity to 97% of its initial capacity. Furthermore, the SSEI layer may weigh less than 1% of the bulk electrolyte present in the battery. Thus, the disrupted SSEI layer may be dispersed within the bulk electrolyte, which may ensure that the disrupted SSEI layer does not reattach to the electrode.

Numerous methods have been developed in theory to treat the SSEI layer and improve the capacity of the battery. However, all such current methods are intrusive, requiring the active materials of the battery to be exposed to the environment. This immediately causes oxidation and evaporation of the active materials and does not allow them to be reused in a battery.

The inventors have recognized and appreciated the need for a non-intrusive approach for removing the SSEI layer of a lithium ion battery. These procedures may be applied periodically to prevent growth of a significant SSEI layer, or after such a layer has been formed to remove it. Described herein are embodiments of various approaches for removing the SSEI layer of a lithium ion battery to recover some or most of its capacity.

The disruption of the SSEI layer may be achieved by utilizing thermal ablation, cavitation, mechanical resonance, X-rays, and/or electronic intervention. In thermal ablation, a local thermal stress may be induced on the SSEI layer by applying focused ultrasound energy to the SSEI layer. The local thermal stress may cause bond dissociation in the SSEI layer. In cavitation, the energy supplied may cause the formation of disruptive microbubbles at the interface of the SSEI layer and electrolyte. By controlling the incident energy, the microbubbles may implode and release a shock wave. This may induce severe mechanical stress on the SSEI layer's bonds, causing disruption. In the resonance method, the frequency chosen for the ultrasound waves may match the resonant frequency of different structures or molecules in the SSEI layer. Resonant frequency is the natural vibrational frequency of a body. If this frequency is matched and a constant amplitude is supplied, the amplitude of vibration in the body may keep increasing until it breaks. This method may require characterization of resonant frequencies for all structures and molecules present in the SSEI layer. X-rays may be used to directly break the chemical bonds holding the SSEI materials together and onto the anode. Electronic interventions may include creating a well-controlled low electronic impedance condition across a battery to induce large and disruptive forces on the constitutive components and the SSEI layer.

In one embodiment, high energy ultrasound may be utilized to disrupt the SSEI layer of the battery. High levels of ultrasound generated by at least one transducer at one or more frequencies and transmitted into the battery may disrupt the relatively weak bonds holding the SSEI layer in place. This may dislodge the material, either mechanically or through thermal heating processes. Pulses (narrow or broadband) of ultrasound or continuous wave excitation may be used.

In another related embodiment, high energy ultrasound of specific frequencies may be utilized to disrupt the SSEI layer of the battery. The bonds of the SSEI layer may have various mechanical resonances that may give rise to large motions if subject to energy at a resonant frequency. The resonant frequency of the bonds may depend on numerous parameters, for example the electronegativity of the elements in the bond, the bond strength, the bond length, and the bond angle. Irradiation with high amplitude ultrasound (pulses or continuous waves) at these resonant frequencies may cause the bonds to respond at high amplitudes of motion which may break the bonds by mechanical forces or thermal shock. As other structures in the battery may have different resonant frequencies, they may not be impacted.

The resonant frequencies of the bonds of the SSEI layer may be determined by exposing sample SSEI materials to a range of frequencies of ultrasound and monitoring the amplitudes of motion. This monitoring may be done with laser interferometry or other suitable means. The peak response may occur at the resonant frequencies of the bonds. Samples of the SSEI layer may be extracted from a battery, or may be fabricated for the purpose of this testing.

Figure 10:
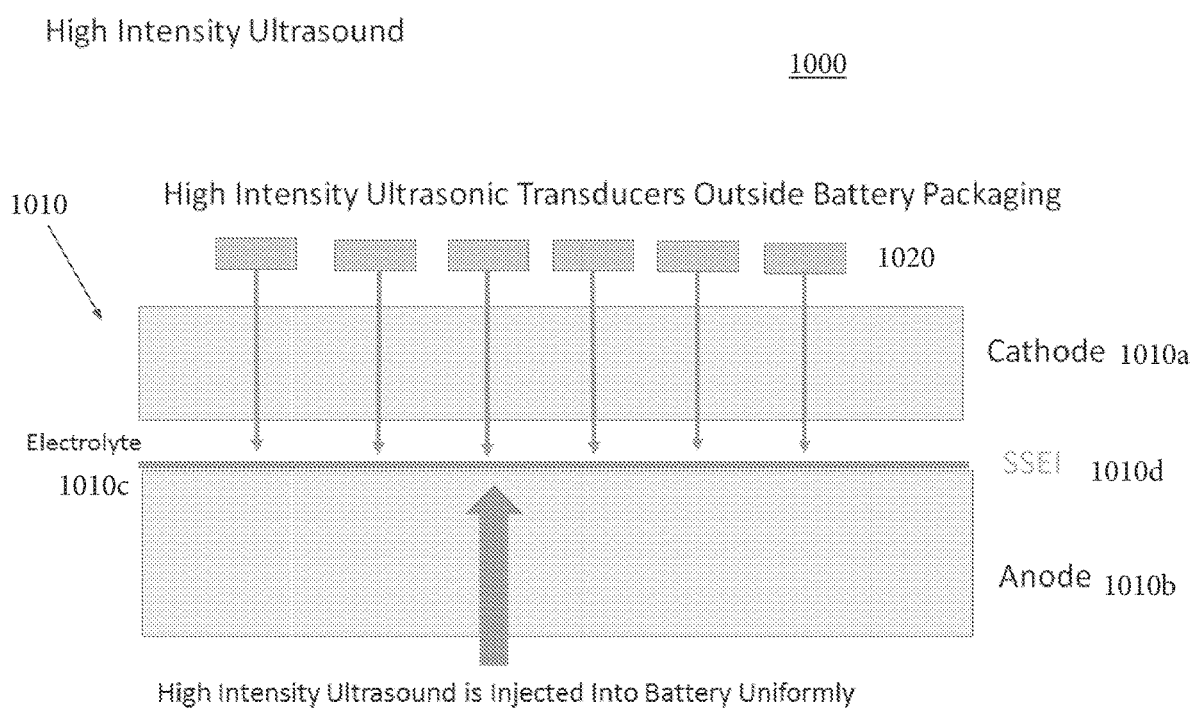
FIG. 10 illustrates an embodiment of a system in which high energy ultrasound may be utilized to disrupt the SSEI layer of a lithium ion battery.

For example, FIG. 10 illustrates an embodiment of a system 1000 in which high energy ultrasound may be utilized to disrupt the SSEI layer of a lithium ion battery. The system 1000 may include at least a battery 1010 (comprising a cathode 1010a, an anode 1010b, electrolyte 1010c, and an SSEI layer 1010d), and a plurality of ultrasound transducers 1020. The plurality of ultrasound transducers 1020 may be configured to transmit high energy ultrasound waves into the battery 1010. As discussed, the frequency of the ultrasound waves may be at a resonant frequency of the bonds of the SSEI layer 1010d. This way, the SSEI layer 1010d may be disrupted without having disadvantageous effects on other components of the battery 1010 (e.g., the cathode 1010a, the anode 1010b, and the electrolyte 1010c).

In another embodiment, high energy ultrasound may be utilized for causing cavitation in the SSEI layer of the battery. As discussed, cavitation is the generation of small voids (bubbles) within a fluid by negative pressures generated by a high intensity ultrasonic wave. The subsequent collapse of the voids may be extremely violent and locally disruptive. Under carefully controlled conditions, cavitation voids may be generated at the surface of the SSEI layer which may dislodge or destroy it.

Figure 11:
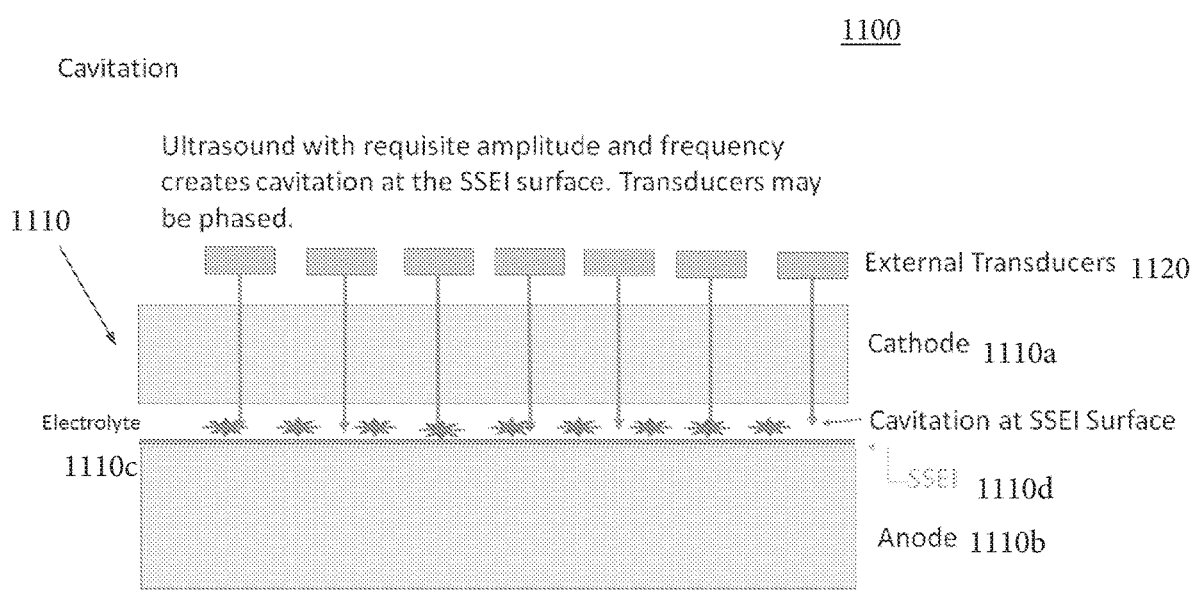
FIG. 11 illustrates an embodiment of a system in which high energy ultrasound may be utilized to cause cavitation in order to disrupt the SSEI layer of a lithium ion battery.

For example, FIG. 11 illustrates an embodiment of a system 1100 in which high energy ultrasound may be utilized to cause cavitation in order to disrupt the SSEI layer of a lithium ion battery. The system 1100 may include at least a battery 1110 (comprising a cathode 1110a, an anode 1110b, electrolyte 1110c, and an SSEI layer 1110d), and a plurality of ultrasound transducers 1120. The plurality of ultrasound transducers 1120 may be configured to transmit ultrasound waves into the battery 1110 in order to cause cavitation at the surface of the SSEI layer or within it. This may create large stresses and/or voids in the SSEI layer 1110d, causing the SSEI layer 1110d to collapse and/or disperse, thus disrupting the SSEI layer 1110d.

In another embodiment, high energy ultrasound may be utilized to excite various structures of the battery. For example, ultrasound at a resonant frequency of the anode/cathode may be transmitted into the battery. This may cause a strong mechanical response of the anode/cathode (e.g. surface waves or other strong vibrations), which may disrupt the SSEI layer. Continuous waves, tone bursts, impulses, and/or chirps may be employed. The resonant frequencies of the structures of the battery may be determined by applying a range of frequencies and amplitudes of ultrasound to a representative material sample and measuring the mechanical and electronic impedance responses.

Figure 12:
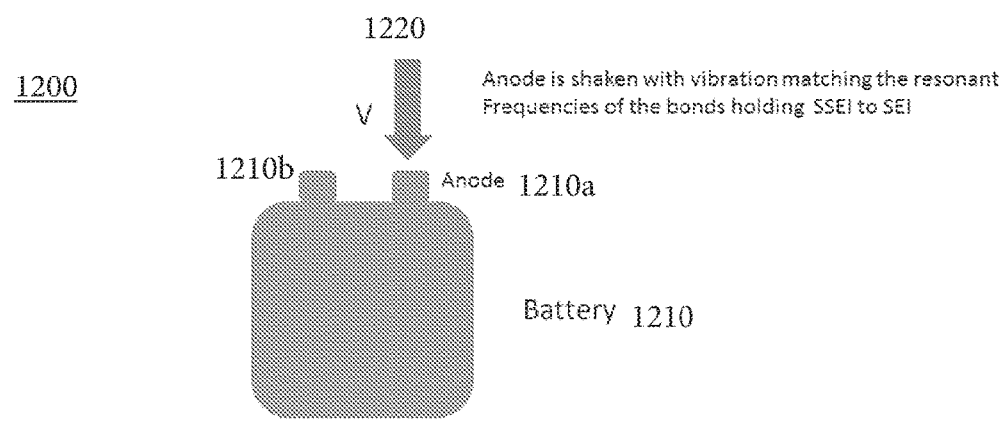
FIG. 12 illustrates a system in which high energy ultrasound may be targeted to structures of a lithium ion battery in order to disrupt the SSEI layer.

For example, FIG. 12 illustrates a system 1200 in which high energy ultrasound may be targeted to resonant structures of a lithium ion battery in order to disrupt the SSEI layer. The system 1200 may include at least a battery 1210 (comprising an anode 1210a and a cathode 1210b), and a vibration 1220. The frequency of the vibration 1220 may be a resonant frequency of the anode 1210a or cathode 1210b. In the example shown in FIG. 12, the vibration 1220 is applied to the anode 1210a at a resonant frequency of the anode 1210a. This may cause strong mechanical response in the anode 1210a, which may disrupt the SSEI layer on the anode 1210a.

In another embodiment, phased array ultrasound may be utilized to disrupt the SSEI layer of the battery. Phased array ultrasound may be capable of generating high ultrasonic levels at particular locations. This method may require multiple transducers, which may be located and oriented around the battery. These transducers may be organized into an array, and the generated ultrasonic waves may be beamformed (to constructively/destructively interfere) so as to deliver high energy ultrasound to one or more desired spatial volumes or planes within the battery. As this method may combine multiple relatively low intensity beams to create local volumes of high acoustic energy, points outside the volume of interest may not be exposed to significant ultrasound and may not be impacted. The high energy ultrasound may manifest itself as heat and, since the SSEI layer may be primarily composed of organic hydrocarbon, the heat may be capable of disrupting the bonds of the SSEI layer. In such an embodiment, the ultrasound waves may have a frequency ranging from approximately 500 kHz to approximately 1 THz.

Converging multiple beams on a single point may be achieved by setting a predetermined phase shift between ultrasound transducers. This may allow for both beam focusing and beam steering to occur. Thus, each ultrasound transducer may be arranged such that the multiple waveforms emitted from the ultrasound transducers constructively interfere at a predetermined location. This may allow for controlled constructive and destructive interference and may allow the ultrasound transducers to apply high energy on a specific region inside the lithium ion battery, and also leave other areas of the lithium ion battery unaltered. This may also allow the ultrasound transducer to utilize multiple low energy beams, rather than a single high energy beam, for example.

The following equation may describe how constructive interference may be modeled in order to determine the path lengths needed for each waveform to travel.

$$R_1 - R_2 = n\lambda$$

In this equation, $R_1$ and $R_2$ represent path lengths of two different waveforms, $\lambda$ represents the wavelength of the waveforms, and n is an integer. If the difference between the two path lengths is an integer multiple of the wavelength of the waveforms, the two waveforms will constructively interfere.

The following equation may describe how destructive interference may be modeled in order to determine the path lengths needed for each waveform to travel.

$$R_1 - R_2 = \lambda/2 + n\lambda$$

In this equation, $R_1$ and $R_2$ represent path lengths of two different waveforms, $\lambda$ represents the wavelength of the waveforms, and n is an integer. If the difference between the two path lengths is half of a wavelength more than an integer multiple of the wavelength, the two waveforms will destructively interfere, thereby producing a position of low acoustic intensity.

By using multiple low energy beams and focusing them on a particular region, stress (thermal or mechanical) induced on regions other than the intended focal region may be minimized. This also may allow for increased intensity of the incident ultrasound radiation on the intended focal region. The total energy delivered to the intended focal region may be a function of intensity of the ultrasound radiation and exposure time. The total energy required to disrupt the SSEI layer of the lithium ion battery may be greater than or equal to the bond energies of the intermolecular and/or intramolecular bonds within the SSEI layer.

Figure 13:
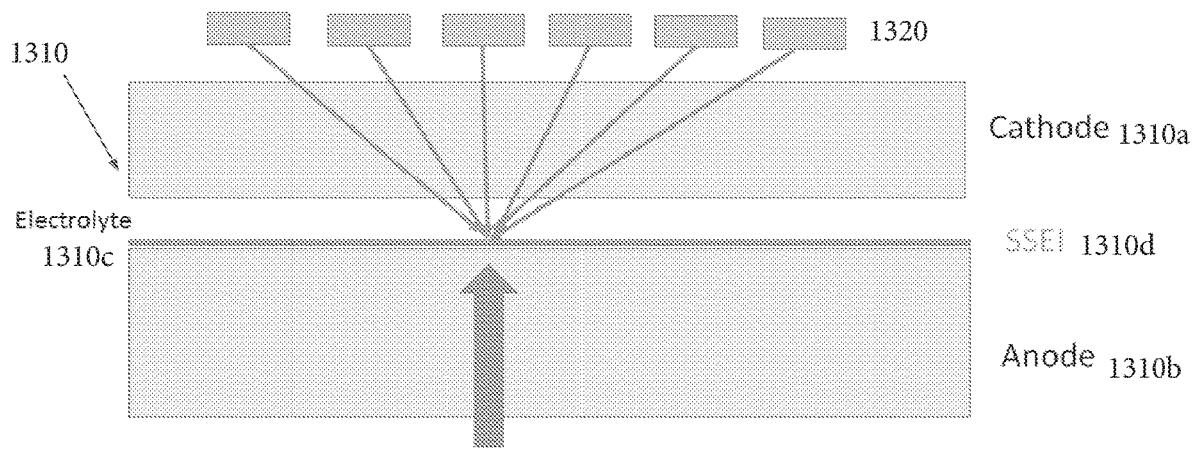
FIG. 13 illustrates an embodiment of a system in which phased array ultrasound may be utilized to disrupt the SSEI layer of a lithium ion battery.

For example, FIG. 13 illustrates an embodiment of a system 1300 in which phased array ultrasound may be utilized to disrupt the SSEI layer of a lithium ion battery. The system 1300 may include at least a battery 1310 (comprising a cathode 1310a, an anode 1310b, electrolyte 1310c, and an SSEI layer 1310d), and a plurality of ultrasound transducers 1320. The plurality of ultrasound transducers 1320 may be configured to transmit ultrasound waves into the battery 1310 to disrupt the SSEI layer 1310d. As previously described, the plurality of ultrasound transducers 1320 may be configured such that ultrasound waves transmitted from the at least one ultrasound transducer 1320 constructively interferes to produce the strongest intensities only at the location of the SSEI layer 1310d. In doing so, other components of the battery (e.g., the cathode 1310a, the anode 1310b, and the electrolyte 1310c) may not be impacted, and the SSEI layer 1310d may be disrupted.

In other embodiments, an ultrasound transducer may focus ultrasound energy with the use of acoustic lenses (e.g., polystyrene, epoxy) or concave transducers.

In another embodiment, X-rays may be implemented to disrupt the SSEI layer. An X-ray is a beam of highly energized photons that may be capable of disrupting the bonds of the SSEI layer. This may be possible when the energy of the X-ray beam is higher than the energy level required to break the bonds of the SSEI layer.

Certain wavelengths of X-rays may also be chosen to target absorption properties of the bonds of the SSEI layer. For example, there may be a particular wavelength or set of wavelengths at which a bond tends to absorb X-ray energy. As the bonds absorb the energy, the bonds may weaken and eventually break, thereby allowing SSEI molecules to become dislodged. By utilizing these particular wavelengths, damage to other materials within the battery may be avoided.

To avoid flooding and use of excessive radiation, this approach may be optimized by using Surface Plasmon Resonance (SPR) waves to guide X-rays to an intended region of the battery, for example between the anodes and cathodes and on the surface of the SSEI layer. SPR is the resonant oscillation of conduction elements at the interface between negative and positive permittivity material stimulated by incident electromagnetic energy. SPR is a non-radiative electromagnetic surface wave that propagates in a direction parallel to the material interfaces. In addition, SPR may allow tuning of the plasmon energy frequencies to match the absorption spectrum of the SSEI material to optimize the match between the wavelength of the incident X-rays and thereby optimize their absorption and effectiveness to disrupt the SSEI layer. Manipulation of the incident angle of the X-ray energy may also provide means to optimize the absorption.

In some embodiments, X-ray absorption spectroscopy (XAS) may be utilized to design an X-ray system to selectively remove the SSEI layer in a lithium ion battery while maintaining the integrity of other structures in the lithium ion battery (e.g., anode, cathode, separator, electrolytes, pouch, current collectors, etc.). As a powerful analytical tool for determining X-ray absorption spectra, XAS may identify wavelengths at which absorption by the SSEI layer is greatest, and thus the X-ray system may be tuned to these wavelengths. The probability that X-rays may be absorbed may follow Beer's law:

$$\mu \cdot x = \ln(I_0/I).$$

In such a case, $\mu$ may be the absorption coefficient, x may be the thickness of the material, $I_0$ may be the intensity of the X-ray incident on the material, and I may be the intensity of the X-ray transmitted through the material.

In general, exposure to X-ray radiation may cause damage to a material in the form of mass loss and/or a change to the chemical structure of the material. Organic materials that contain aromatic groups may be less resistant to mass loss than inorganic materials. In a lithium ion battery, many of the vital components of the battery are inorganic and thus may suffer minimal radiation damage from the X-rays. Conversely, the SSEI layer may be organic and thus may suffer significant mass loss due to X-ray radiation. In this way, the capacity of the lithium ion battery may be restored by removing the SSEI layer with X-ray radiation.

Figure 14:
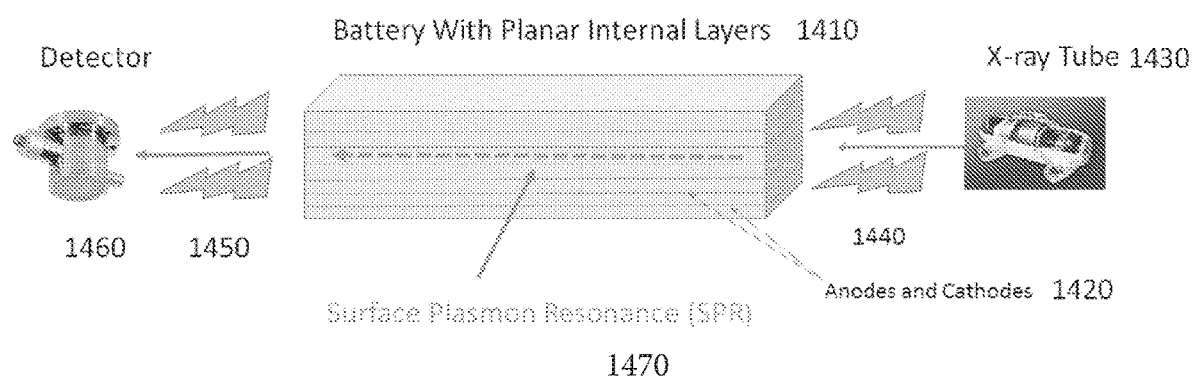
FIG. 14 illustrates an embodiment of a system in which X-rays may be utilized to disrupt the SSEI layer of a lithium ion battery.

X-rays, both with and without SPR, may be implemented to determine a battery's SoC and SoH and to disrupt the SSEI layer of the battery, for example, in connection with FIG. 9. FIG. 14 illustrates an embodiment of a system 1400 in which the SPR concept is employed. The system 1400 may include a battery 1410, including electrodes (anodes and cathodes) forming planes consisting of anodes and cathodes 1420. The system 1400 may also include at least one X-ray tube source 1430 configured to generate X-rays 1440. The at least one X-ray tube source 1430 may be configured to generate X-rays 1440 at an edge of the battery 1410, wherein the X-rays 1440 enter the battery 1410 between the electrodes 1420 and create SPR standing waves 1470. Absorption of the X-rays 1440 and the SPR standing waves 1470 between the electrodes 1420 may disrupt and remove the SSEI layer of the battery 1410. The system 1400 may further include at least one detector 1460, which may be configured to receive and measure transmitted X-rays 1450 that pass through the battery 1410, which may aid in monitoring the process.

In another embodiment, alternating current may be utilized to disrupt the SSEI layer of the battery. Application of alternating electrical current to the lithium ion battery at frequencies at which the anode has a strong resonant mechanical response may create surface waves (or other high amplitude vibrations) capable of disrupting the SSEI layer. This may also generate sufficient heat to destroy the SSEI layer. The desired frequencies of the alternating electric current may be determined by applying a range of frequencies and amplitudes of current to a battery or to a representative material sample and measuring the mechanical and electronic impedance responses.

Figure 15:
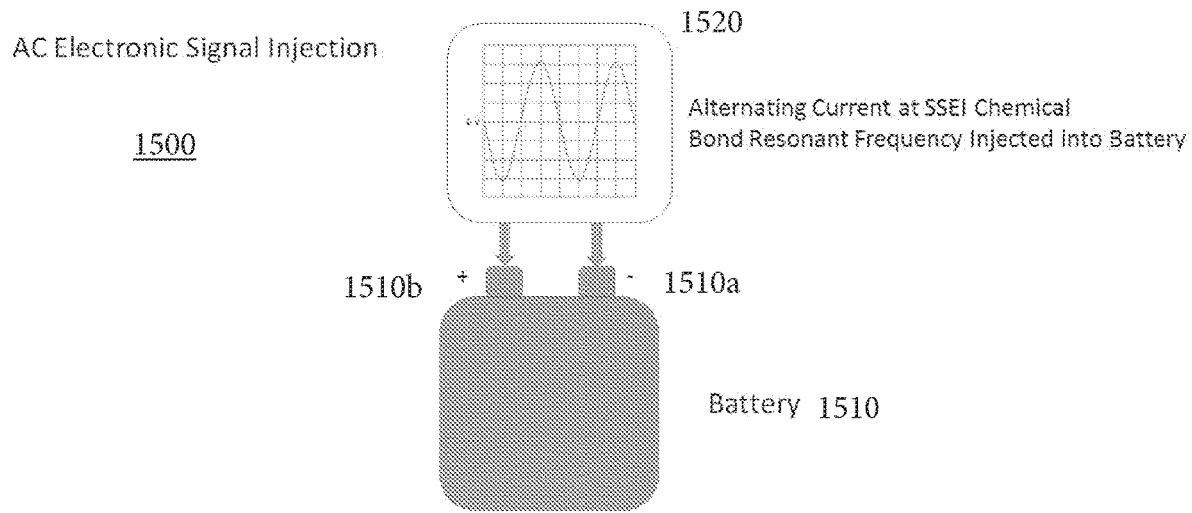
FIG. 15 illustrates an embodiment of a system in which alternating current may be utilized to disrupt the SSEI layer of a lithium ion battery.

For example, FIG. 15 illustrates an embodiment of a system 1500 in which alternating current may be utilized to disrupt the SSEI layer of a lithium ion battery. The system 1500 may include a battery (comprising at least an anode 1510a and a cathode 1510b), and an alternating current source 1520. The alternating current source 1520 may be connected to the anode 1510a and the cathode 1510b of the battery 1510 and drive an alternating current through the battery 1510. The frequency of the alternating current generated by the alternating current source 1520 may be chosen depending on properties of the anode 1510a and the cathode 1510b (e.g., composition). This may create a mechanical response and/or heat in the battery 1510, which may disrupt the SSEI layer of the battery 1510.

In another embodiment, the SSEI layer of the battery may be disrupted using "controlled short circuiting." As discussed, in normal operation of the battery, lithium ions attempt to enter and exit the crystal structure of the anode and cathode during charge and discharge. The rate at which this process occurs may be determined by the current that flows through the battery. By forcing a large current through the battery, the lithium ions may be energized and thus may move rapidly and/or forcibly to enter/exit the crystal structure of the anode/cathode. This may result in strong and disruptive mechanical stresses on the anode and the SSEI layer, an increase in the internal pressure of the electrodes or another component, and/or very high temperatures, any of which may disrupt the SSEI layer. In one embodiment, a large current of this type may be generated by placing a relatively low impedance load across the terminals of the battery either temporarily or periodically. The load may be optimized by selecting the best combination of resistance, capacitance, and inductance, as well as the frequency and duration of application. In such an embodiment, this may generate a large amount of heat within the battery, and the battery may need to be cooled during the process.

Figure 16:
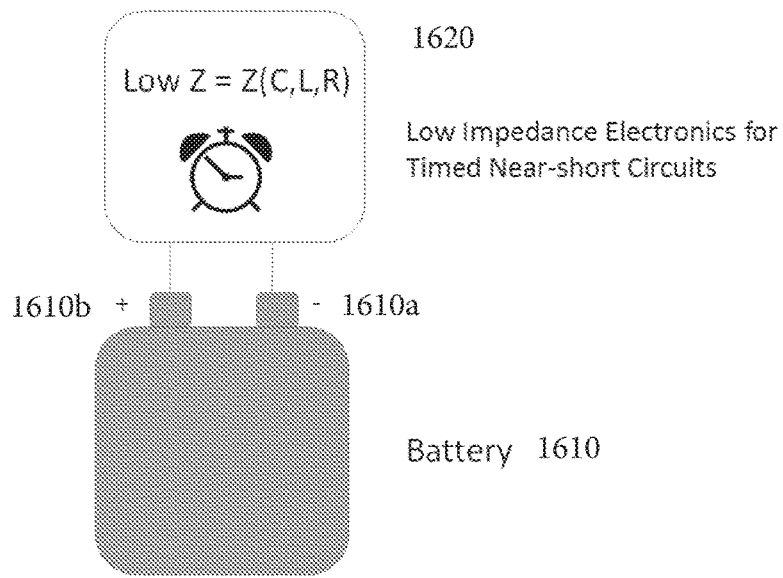
FIG. 16 illustrates an embodiment of a system in which controlled short circuiting may be utilized to disrupt the SSEI layer of a lithium ion battery.

For example, FIG. 16 illustrates an embodiment of a system 1600 in which "controlled short circuiting" may be utilized to disrupt the SSEI layer of a lithium ion battery. The system 1600 may include at least a battery 1610 (comprising at least an anode 1610*a* and a cathode 1610*b*), and circuitry 1620 configured to create a condition similar to a "short circuit' of the battery 1610 in a controlled manner. The circuitry 1620 may be connected to the anode 1610*a* and the cathode 1610*b* of the battery 1610, and may be configured to carefully approximate a short circuit. The circuitry 1620 may "short circuit" the battery by placing a relatively low impedance across the anode 1610*a* and the cathode 1610*b*, and forcing a large current through the battery 1610. This may result in an increase in the internal pressure, temperature, and/or stress fields within the battery 1610, and thus the SSEI layer of the battery 1610 may be disrupted.

In another embodiment, a squeeze film may be utilized to disrupt the SSEI layer of the battery. A squeeze film is the generation of high-oscillating fluid velocities parallel to surfaces bounding a thin fluid channel that creates very high shear stresses on the surfaces. A squeeze film may be created within the channel formed by the anode, electrolyte, and the cathode. Volume conserving mechanical vibration of these surfaces (e.g. rocking motion about a pivot point close to the geometrical center of the anode) may create strong forces on the electrolyte that drive oscillating velocities parallel to the plate, which in turn may generate high shear at the surface boundary layer (the SSEI layer). The generated velocities parallel to the surfaces may be amplified over the velocities of vertical motions of the moving surfaces by a factor of the ratio of the size of the moving surface to the gap between surfaces. For example, for a rocking plate of length d over a fluid gap of width a, the velocity parallel to the surface may be a factor of d/a times larger than the velocity of the rocking motion. The high shear at the surface of the anode may dislodge the SSEI layer.

Figure 17:
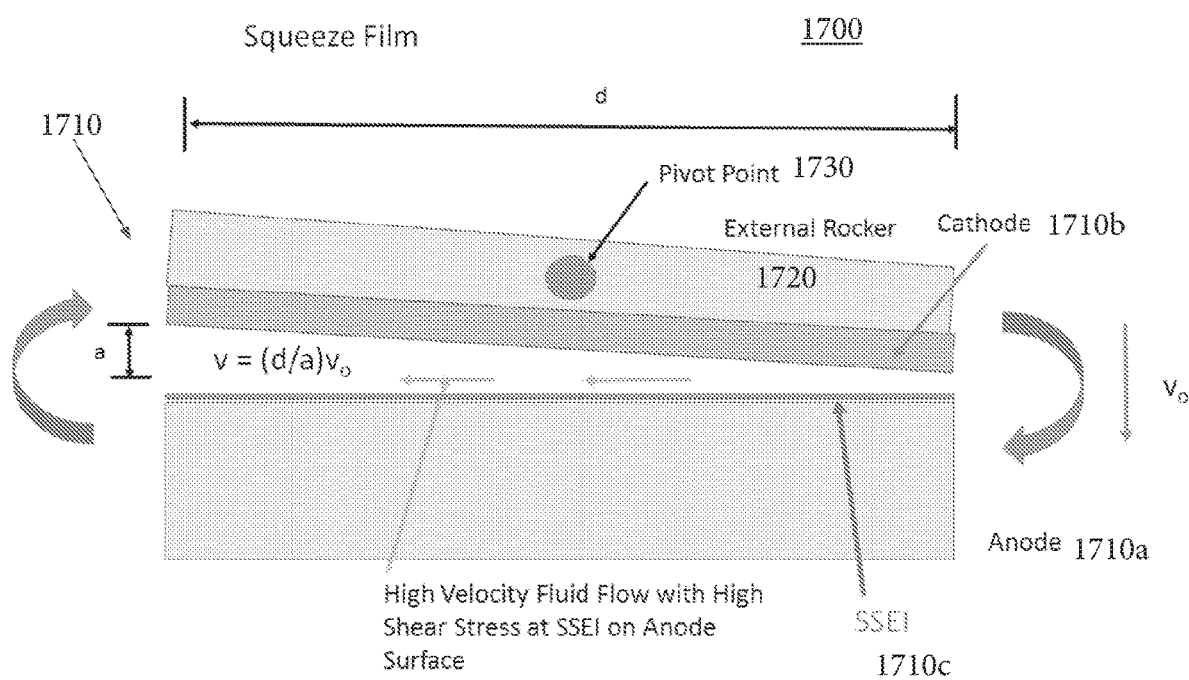
FIG. 17 illustrates an embodiment of a system in which a squeeze film may be utilized to disrupt the SSEI layer of a lithium ion battery.

For example, FIG. 17 illustrates an embodiment of a system 1700 in which a squeeze film may be utilized to disrupt the SSEI layer of a lithium ion battery. The system 1700 may include at least a battery 1710 (comprising at least an anode 1710*a*, a cathode 1710*b*, and an SSEI layer 1710*c*), and a plate-like external rocker 1720. The external rocker 1720 may be configured to harmonically drive the internal electrolyte of the battery 1710 into large harmonic horizontal motions by rocking motion about an axis through a pivot point 1730 (the axis is oriented into the page). The velocity of these horizontal motions may be (d/a)$v_0$, where d is the length of the rocker, a is the thickness of the channel, and $v_0$ is the velocity of vertical motion at the ends of the rocker. This may generate a squeeze film in the channel between the anode 1710*a* and cathode 1710*b* of the battery 1710, and may create very high shear stresses on the surface of the anode 1710*a* and cathode 1710*b*. The shear stresses may be enough to disrupt the SSEI layer 1710*c* of the battery 1710.

In another embodiment, centrifuge-induced surface shear rotation may be utilized to disrupt the SSEI layer of the battery. Centrifuge-induced surface shear rotation of a flat battery about an axis perpendicular to the plane of the battery, either continuous (spinning) or oscillatory, may generate fluid flows in the electrolyte parallel to the anode and cathode surfaces. These fluid flows may generate high shear rates at the surfaces that may disrupt the SSEI layer. The fluid flows may be both circumferential and radial. Radial fluid flows may tend to flush fragments of the disrupted SSEI layer towards the outer edge of the battery.

Figure 18:
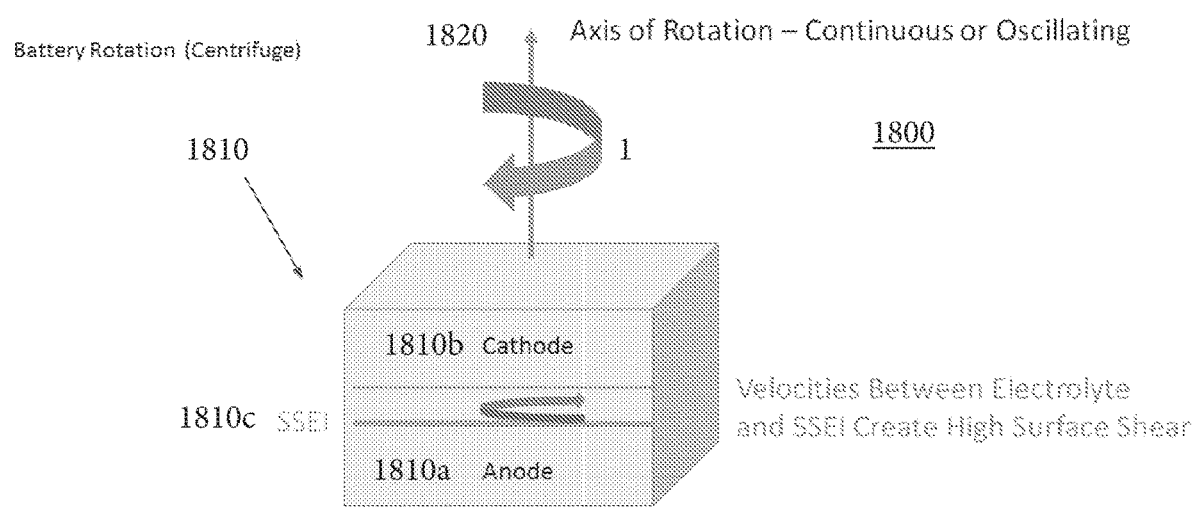
FIG. 18 illustrates an embodiment of a system in centrifuge-induced surface shear rotation may be utilized to disrupt the SSEI layer of a lithium ion battery.

For example, FIG. 18 illustrates an embodiment of a system 1800 in which centrifuge-induced surface shear may be utilized to disrupt the SSEI layer of a lithium ion battery. The system 1800 may include at least a battery 1810 (comprising at least an anode 1810*a*, a cathode 1810*b*, and an SSEI layer 1810*c*). The system 1800 may be configured such that the battery 1810 is rotated about an axis 1820. The axis 1820 may be oriented perpendicular to the plane of the battery 1810, may pass through the battery 1810, and the rotation may be continuous or oscillating. In doing so, centrifuge-induced surface shear forces may be generated in the electrolyte on the surface of the anode 1810*a* and the cathode 1810*b*, and may be strong enough to disrupt the SSEI layer 1810*c* of the battery 1810.

In another embodiment, high energy ultrasound may be utilized to generate high velocity acoustic streaming parallel to the surface. In the presence of high (nonlinear) ultrasonic fields, the electrolyte may be put into steady motion, which may typically be in the direction away from the ultrasonic transducer. High velocities may be so generated in narrow channels (e.g. the channel formed by the anode, electrolyte, and the cathode of the battery) and may generate enough surface shear to disrupt the SSEI layer.

Figure 19:
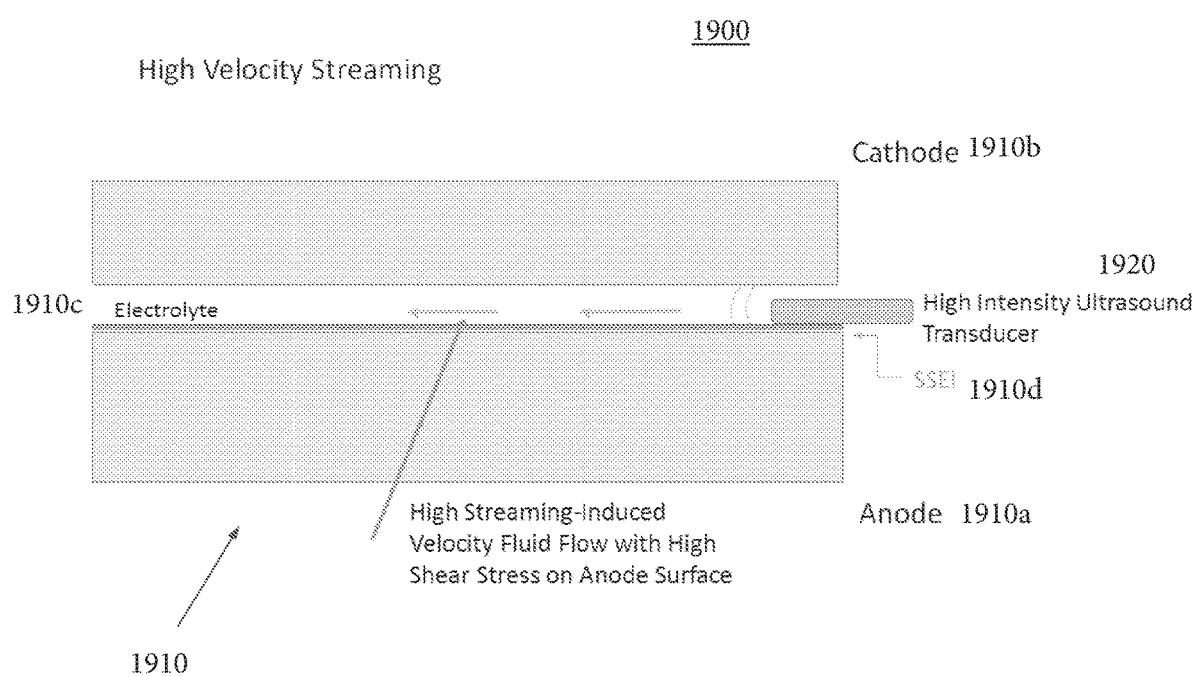
FIG. 19 illustrates an embodiment of a system in which high energy ultrasound may be utilized to generate high velocity acoustic streaming in order to disrupt the SSEI layer of a lithium ion battery.

For example, FIG. 19 illustrates an embodiment of a system 1900 in which high energy ultrasound may be utilized to generate high velocity acoustic streaming in order to disrupt the SSEI layer of a lithium ion battery. The system 1900 may include at least a battery 1910 (comprising at least an anode 1910*a*, a cathode 1910*b*, electrolyte 1910*c*, and an SSEI layer 1910*d*), and a high intensity ultrasound transducer 1920). The high intensity ultrasound transducer 1920 may be configured to transmit a high energy ultrasound wave parallel to the surfaces of the anode 1910*a* and the cathode 1910*b*. The ultrasound wave transmitted by the high energy ultrasound transducer 1920 may induce flow within the electrolyte at a velocity high enough to generate high surface shear that can disrupt the SSEI layer 1910*d* of the battery 1910. More than one such ultrasound transducer may be used to generate these velocities uniformly across the anode surface In another embodiment, the environment of the battery may be controlled to affect the bonds of the SSEI layer. In either hot or cold conditions, or as a result of thermal shock, bonds of the SSEI layer may be disrupted. By carefully applying or removing heat from the battery, bonds of the SSEI layer may be disrupted. Controlling the environment of the battery may be advantageously used in conjunction with any of the other described methods of disrupting the SSEI layer of the battery.

In another embodiment, impulse forces may be utilized to disrupt the SSEI layer of the battery. For example, thermal, mechanical, and/or electronic shocks may be applied to the battery to disrupt the SSEI layer. These may be generated, for example, by rapidly heating or cooling the battery, mechanically shocking the battery (e.g. hitting it with a hammer), and/or application of electrical impulses into the battery.

Described herein are various methods of disrupting the SSEI layer of a lithium ion battery. It should be appreciated that each of these methods may be used individually, or in any combination, in order to disrupt the SSEI layer of a lithium ion battery.

It should be further appreciated that each method for determining the SoC and SoH of a lithium ion battery and each method for disrupting the SSEI layer of the lithium ion battery may be parts of a larger process for treating a lithium ion battery. The process for treating the lithium ion battery may include at least one or a combination of methods, as described herein, for determining the SoC and SoH of the lithium ion battery, and at least one or a combination of methods, as described herein, for disrupting the SSEI layer of the lithium ion battery.

Figure 20:
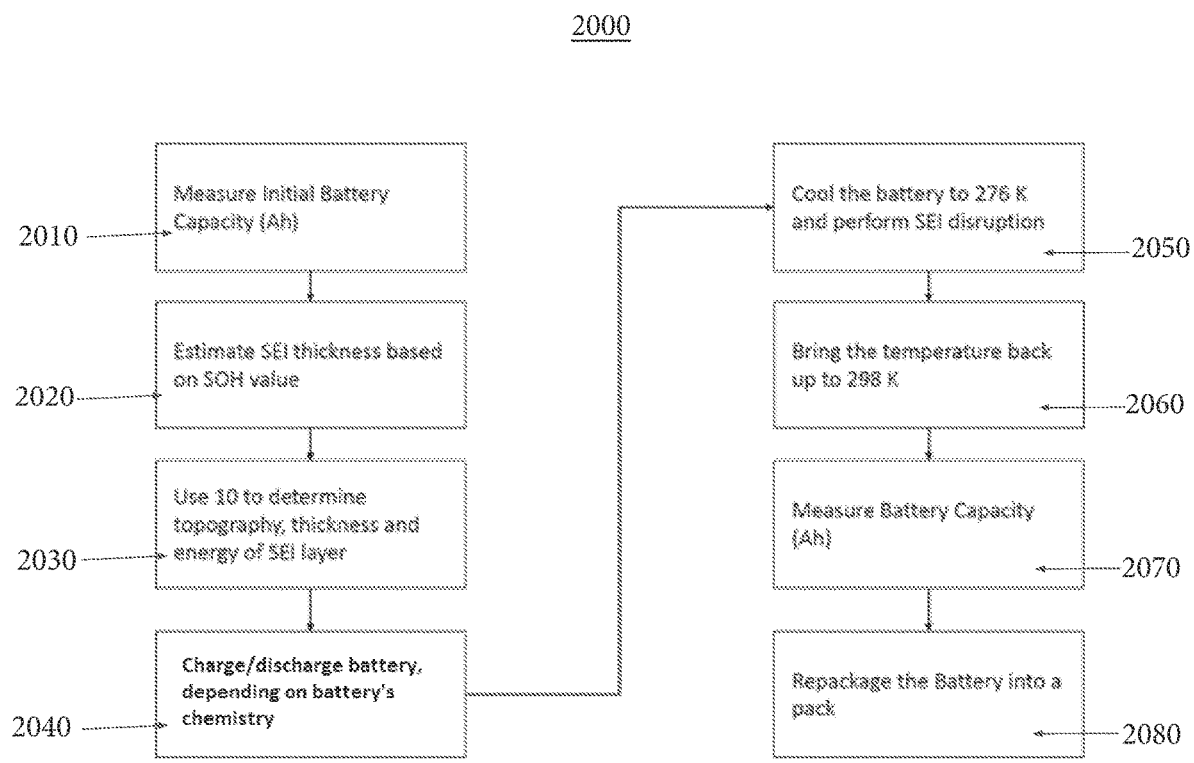
FIG. 20 illustrates a process flow of an example process for treating a lithium ion battery.

For example, FIG. 20 illustrates a process flow 2000 of an example process for treating a lithium ion battery. In one embodiment of the process flow 2000, at least one ultrasound transducer (or, alternatively, a sonic (audio range) transducer) is utilized to both determine the SoC and SoH of the battery as well as disrupt the SSEI layer of the battery. However, it should be appreciated that any of the methods described herein for determining the SoC and SoH of the lithium ion battery and any of the methods for disrupting the SSEI layer of the battery may be utilized.

Before the process flow 2000 begins, the lithium ion battery may be removed from its package and prepared for the procedure. This may be done to improve coupling efficiency and reduce attenuation loss between the at least one ultrasound transducer and the outer polymer packaging of the lithium ion battery. The process flow 2000 may include a step 2010 in which the lithium ion battery is cycled through one charge/discharge cycle, and a current SoC and SoH may be determined. The process flow 2000 may then include a step 2020 in which the SSEI thickness may be estimated based on the SOC and SoH value. This may be done by accessing a database in which SSEI thicknesses corresponding to various SoC and SoH values are stored.

The process flow 2000 may then include a step 2030 in which the at least one ultrasound transducer, operating in a first mode, is used to characterize the energy and topography of the SSEI layer on the electrodes of the lithium ion battery. This may be done by using sound waves at different incident angles and frequencies to decouple, isolate, and visualize multiple layers of the lithium ion battery. These scans of the current battery may be compared to a database of scanned batteries as different charges which are correlated to thickness and position of the SSEI layer. This information may be stored in the database for use in later lithium ion battery treatment.

The process flow 2000 may include a step 2040 in which, in preparation for a treatment to disrupt the SSEI layer, the lithium ion battery is discharged/charged, depending on the chemistry of the specific battery. For example, during discharge, lithium ions may travel from the anode of the battery to the cathode of the battery. Discharging the lithium ion battery places all ions in the cathode and may prevent the possibility of inducing a spontaneous and potentially harmful reaction due to energy being applied during SSEI treatment. The process flow 2000 may then include a step 2050 in which the temperature of the lithium ion battery is gradually lowered, perhaps to approximately 276 K, in order to limit ion mobility and lithium excitation and further prevent the possibility of an undesirable reaction during SSEI disruption. This step also may reduce the risk of combustion of both the highly lithiated electrolyte and the delithiated electrolyte. In some embodiments, the process flow 2000 may return to step 2040 to ensure that all of the lithium ions have moved to the cathode of the battery.

The process flow 2000 may then, at step 2050, perform the SSEI disruption using one or more of the techniques described above. The process flow 2000 may then include a step 2060 in which the temperature is brought back up to 298 K. The process flow 2000 may then include a step 2070 in which the battery capacity is measured again, and the SoC and SoH of the lithium ion battery may be determined again. If the SoC and SoH of the battery are sufficient, the process flow 2000 may include a step 2080 in which the lithium ion battery is returned to its package, and the process flow 2000 completes.

After the process flow 2000 is finished, the lithium ion battery may have been restored to a substantial fraction of its initial capacity. In some embodiments, the lithium ion battery may have been restored to approximately 97% of its initial capacity. At this point, the rate of degradation of the capacity of the battery (i.e. the rate of formation of the SSEI layer) may remain the same as its initial rate of degradation. The rate of degradation of the capacity of the battery may be the same after SSEI treatment as it is when the battery is made, as the rate of degradation may not depend on the state of the SSEI layer.

Figure 21:
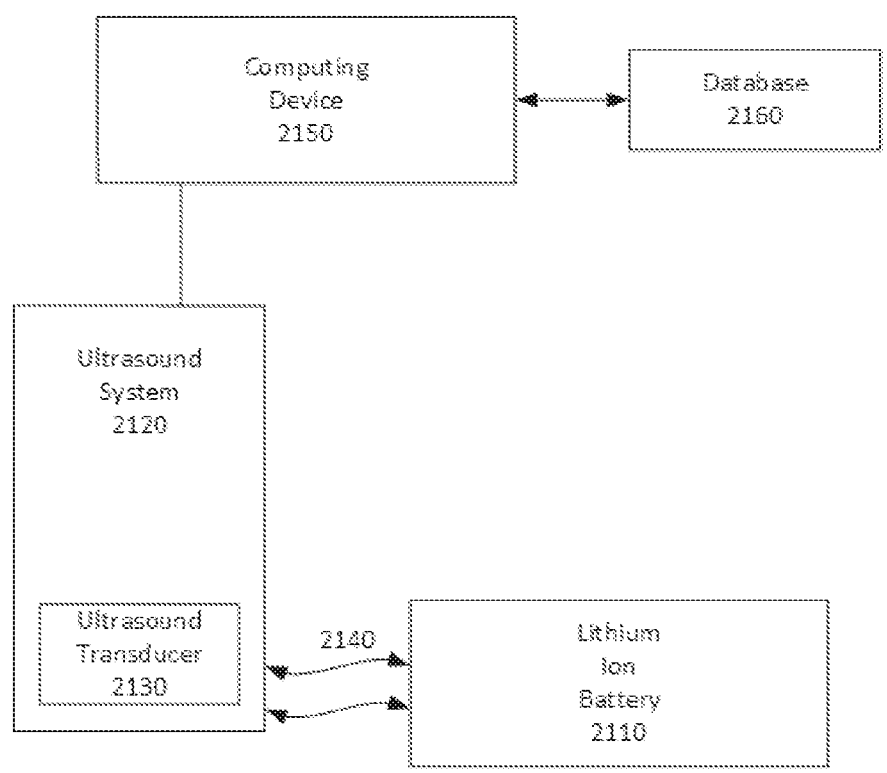
FIG. 21 illustrates an embodiment of a system in which an approach for using ultrasound to treat a lithium ion battery may be implemented.

FIG. 21 illustrates an embodiment of a system 2100 in which an approach for using ultrasound to treat a lithium ion battery may be implemented. In the system 2100, at least one ultrasound transducer is utilized to both determine the SoC and SoH of the battery as well as disrupt the SSEI layer of the battery. However, it should be appreciated that any of the methods for determining the SoC and SoH of the lithium ion battery and any of the methods for disrupting the SSEI layer of the battery may be utilized in the system 2100.

In some embodiments, an ultrasound system 2120 may include at least one ultrasound transducer 2130. The at least one ultrasound transducer 2130 may generate ultrasound waves 2140 to treat the SSEI layer of a lithium ion battery 2110. In some embodiments, the at least one ultrasound transducer 2130 may operate in a first mode in order to scan the lithium ion battery 2110 and determine the SoC and SoH of the lithium ion battery 2110. In the first mode, the at least one ultrasound transducer 2130 may generate ultrasound waves 2140 of relatively low energy. The at least one ultrasound transducer 2130 may detect a reflection of the ultrasound waves 2140. The ultrasound system 2120 may communicate with a computing device 2150 in order to determine the SoC and SoH of the lithium ion battery 2110 based on the reflected ultrasound waves detected by the at least one ultrasound transducer 2130. The computing device 2150 may communicate with a database 2160 that stores information relating to the lithium ion battery 2110, including information correlating the SoC and SoH of the lithium ion battery 2110 to reflected ultrasound waves. The database 2160 may also include manufacturing information relating to the lithium ion battery 2110. For example, for a particular lithium ion battery 2110, the database 2160 may contain the battery's serial number and the location of various components in the battery. In this way, the system may be able to easily locate and characterize the SSEI layer of the lithium ion battery 2110. There may be a bidirectional connection between the computing device 2150 and the database 2160.

In some embodiments, the at least one ultrasound transducer 2130 may operate in a second mode in order to disrupt the SSEI layer of the lithium ion battery 2110. In the second mode, the at least one ultrasound transducer 2130 may generate ultrasound waves 2140 of a higher energy than in the first mode. The at least one ultrasound transducer 2130 may generate ultrasound waves 2140 in order to target the SSEI layer characterized in the first mode. To do this, the at least one ultrasound transducer 2130 may generate ultrasound wave patterns that form volumes containing constructive interference at a location in the SSEI layer.

In the system illustrated in FIG. 21, there is at least one lithium ion battery 2110, at least one ultrasound transducer 2130 in the ultrasound system 2120, at least one computing device 2150, and at least one database 2160. It should be appreciated that this system is merely an illustration, and other arrangements of a system to disrupt the SSEI layer of a lithium ion cell/module/pack using ultrasound are possible. For example, the ultrasound system 2120 may be able to treat multiple lithium ion batteries 2110 at once. There may be multiple ultrasound transducers 2130 in the ultrasound system 2120, and they may be arranged in order to effectively treat one or multiple lithium ion batteries 2110. In such an embodiment, the ultrasound transducers 2130 may be able to operate in parallel and treat several lithium ion batteries at once. The ultrasound transducers 2130 may be able to operate such that at least one ultrasound transducer 2130 is operating in the first mode while at least one ultrasound transducer 2130 is operating in the second mode.

In the system illustrated in FIG. 21, the computing device 2150 is shown as an external computing device. In such an embodiment, the ultrasound system 2120 may be connected to the computing device 2150 such that the two may communicate and exchange information relating to the lithium ion battery 2110 in order to characterize and identify the SSEI layer. The ultrasound system 2120 may be connected to the computing device 2150 with a wire, wirelessly, with a bidirectional bus, or any other suitable connection. Additionally, there may be more than one computing device 2150, and the computing devices(s) 2150 may be incorporated in the ultrasound system 2120. The database 2160 is shown as a database external to the computing device 2150, but it should be appreciated that the database 2160 may also be incorporated into the computing device 2150.

Figure 22:
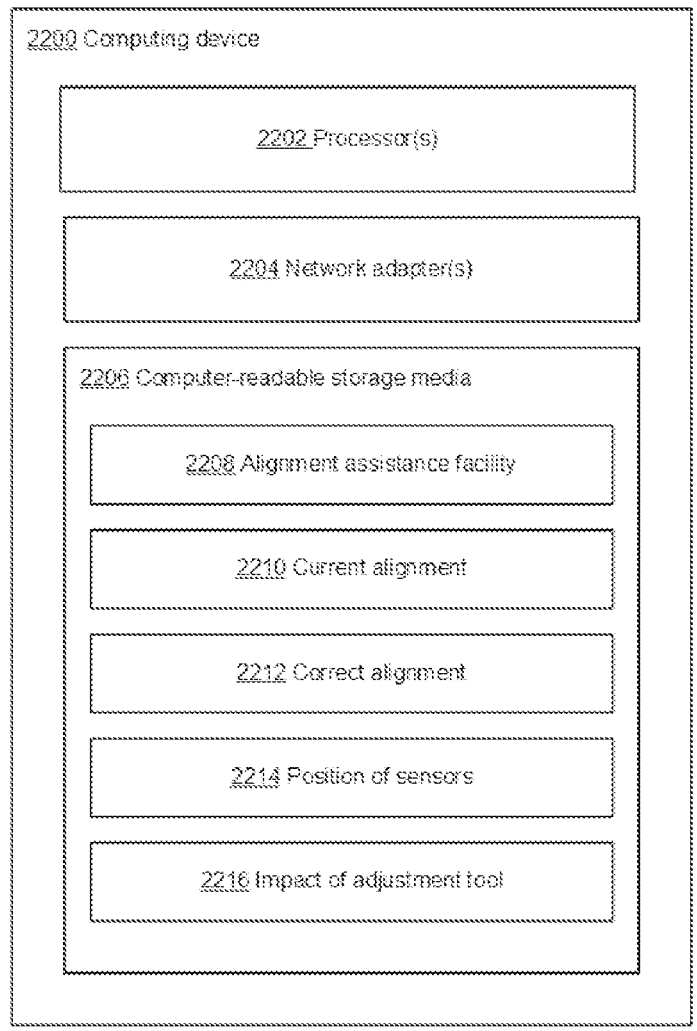
FIG. 22 illustrates an embodiment of a computing device for receiving and analyzing signals in a system for treating a lithium ion battery.

FIG. 22 illustrates an embodiment of a computing device for receiving and analyzing signals in a system for treating a lithium ion battery. In one embodiment, the computing device 2200 may include at least one processor(s) 2202 and at least one network adapter(s) 2204. The computing device may also include computer readable storage media 2206 which may include an alignment assistance facility module 2208, a current alignment module 2210, a correct alignment module 2212, a position of sensors module 2214, and an impact of adjustment tool module 2216. The computing device 2200 may be designed to receive and analyze signals from a system utilizing a method for determining the SoC and SoH of a lithium ion battery as described herein (e.g., an ultrasound system), in order to characterize and identify the SSEI layer of the lithium ion battery.

Techniques operating according to the principles described herein may be implemented in any suitable manner. Included in the discussion above are a series of flow charts showing the steps and acts of various processes that determine the SoC and SoH of a lithium ion battery and disrupt the SSEI layer of the lithium ion battery. The processing and decision blocks of the flow charts above represent steps and acts that may be included in algorithms that carry out these various processes. Algorithms derived from these processes may be implemented as software integrated with and directing the operation of one or more single- or multi-purpose processors, may be implemented as functionally-equivalent circuits such as a Digital Signal Processing (DSP) circuit or an Application-Specific Integrated Circuit (ASIC), or may be implemented in any other suitable manner. It should be appreciated that the flow charts included herein do not depict the syntax or operation of any particular circuit or of any particular programming language or type of programming language. Rather, the flow charts illustrate the functional information one skilled in the art may use to fabricate circuits or to implement computer software algorithms to perform the processing of a particular apparatus carrying out the types of techniques described herein. It should also be appreciated that, unless otherwise indicated herein, the particular sequence of steps and/or acts described in each flow chart is merely illustrative of the algorithms that may be implemented and can be varied in implementations and embodiments of the principles described herein.

Accordingly, in some embodiments, the techniques described herein may be embodied in computer-executable instructions implemented as software, including as application software, system software, firmware, middleware, embedded code, or any other suitable type of computer code. Such computer-executable instructions may be written using any of a number of suitable programming languages and/or programming or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application. In other implementations, the functional facilities may be adapted to interact with other functional facilities in such a way as form an operating system, including the Windows® operating system, available from the Microsoft® Corporation of Redmond, Wash. In other words, in some implementations, the functional facilities may be implemented alternatively as a portion of or outside of an operating system.

Some exemplary functional facilities have been described herein for carrying out one or more tasks. It should be appreciated, though, that the functional facilities and division of tasks described is merely illustrative of the type of functional facilities that may implement the exemplary techniques described herein, and that embodiments are not limited to being implemented in any specific number, division, or type of functional facilities. In some implementations, all functionality may be implemented in a single functional facility. It should also be appreciated that, in some implementations, some of the functional facilities described herein may be implemented together with or separately from others (i.e., as a single unit or separate units), or some of these functional facilities may not be implemented.

Computer-executable instructions implementing the techniques described herein (when implemented as one or more functional facilities or in any other manner) may, in some embodiments, be encoded on one or more computer-readable media to provide functionality to the media. Computer-readable media include magnetic media such as a hard disk drive, optical media such as a Compact Disk (CD) or a Digital Versatile Disk (DVD), a persistent or non-persistent solid-state memory (e.g., Flash memory, Magnetic RAM, etc.), or any other suitable storage media. Such a computer-readable medium may be implemented in any suitable manner, including as computer-readable storage media 2206 of FIG. 22 described above (i.e., as a portion of a computing device 2200) or as a stand-alone, separate storage medium. As used herein, "computer-readable media" (also called "computer-readable storage media") refers to tangible storage media. Tangible storage media are non-transitory and have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

Further, some techniques described above comprise acts of storing information (e.g., data and/or instructions) in certain ways for use by these techniques. In some implementations of these techniques—such as implementations where the techniques are implemented as computer-executable instructions—the information may be encoded on a computer-readable storage media. Where specific structures are described herein as advantageous formats in which to store this information, these structures may be used to impart a physical organization of the information when encoded on the storage medium. These advantageous structures may then provide functionality to the storage medium by affecting operations of one or more processors interacting with the information; for example, by increasing the efficiency of computer operations performed by the processor(s).

In some, but not all, implementations in which the techniques may be embodied as computer-executable instructions, these instructions may be executed on one or more suitable computing device(s) operating in any suitable computer system, including the exemplary computer system of FIG. 22, or one or more computing devices (or one or more processors of one or more computing devices) may be programmed to execute the computer-executable instructions. A computing device or processor may be programmed to execute instructions when the instructions are stored in a manner accessible to the computing device or processor, such as in a data store (e.g., an on-chip cache or instruction register, a computer-readable storage medium accessible via a bus, a computer-readable storage medium accessible via one or more networks and accessible by the device/processor, etc.). Functional facilities comprising these computer-executable instructions may be integrated with and direct the operation of a single multi-purpose programmable digital computing device, a coordinated system of two or more multi-purpose computing devices sharing processing power and jointly carrying out the techniques described herein, a single computing device or coordinated system of computing device (co-located or geographically distributed) dedicated to executing the techniques described herein, one or more Field-Programmable Gate Arrays (FPGAs) for carrying out the techniques described herein, or any other suitable system.

FIG. 22 illustrates one exemplary implementation of a computing device in the form of a computing device 2200 that may be used in a system implementing techniques described herein, although others are possible. It should be appreciated that FIG. 22 is intended neither to be a depiction of necessary components for a computing device to operate as a means for receiving and analyzing signals from a system for determining the SoC and SoH of a lithium ion battery in accordance with the principles described herein, nor a comprehensive depiction.

Computing device 2200 may comprise at least one processor 2202, a network adapter 2204, and computer-readable storage media 2206. Computing device 2200 may be, for example, a desktop or laptop personal computer, a personal digital assistant (PDA), a smart mobile phone, a server, a wireless access point or other networking element, or any other suitable computing device. Network adapter 2204 may be any suitable hardware and/or software to enable the computing device 2200 to communicate wired and/or wirelessly with any other suitable computing device over any suitable computing network. The computing network may include wireless access points, switches, routers, gateways, and/or other networking equipment as well as any suitable wired and/or wireless communication medium or media for exchanging data between two or more computers, including the Internet. Computer-readable storage media 2206 may be adapted to store data to be processed and/or instructions to be executed by processor 2202. Processor 2202 enables processing of data and execution of instructions. The data and instructions may be stored on the computer-readable storage media 2206 and may, for example, enable communication between components of the computing device 2200.

The data and instructions stored on computer-readable storage media 2206 may comprise computer-executable instructions implementing techniques which operate according to the principles described herein. In the example of FIG. 22, computer-readable storage media 2206 stores computer-executable instructions implementing various facilities and storing various information as described above. Computer-readable storage media 2206 may store computer-executable instructions for receiving and processing signals from a system for determining the SoC and SoH of a lithium ion battery, and displaying results on a screen.

While not illustrated in FIG. 22, a computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the principles described herein. Accordingly, the foregoing description and drawings are by way of example only.

An apparatus for measuring the State of Charge (SoC) and State of Health (SoH) of a lithium ion battery may be embodied in different configurations. Example configurations may include any combination or combinations of configurations (1) through (22) and (123) as described below.

(1) An apparatus for measuring the State of Charge (SoC) and/or State of Health (SoH) of a lithium ion battery, the apparatus comprising: at least one device configured to measure physical and/or chemical characteristics of the lithium ion battery, wherein the SoC and the SoH of the lithium ion battery are determined from the measured physical and/or chemical characteristics.

(2) The apparatus of configuration (1), wherein the at least one device comprises at least one ultrasound transducer.

(3) The apparatus of configurations (2), wherein the at least one ultrasound transducer comprises: at least one transmitting ultrasound transducer configured to be located on one side of the lithium ion battery; and at least one receiving ultrasound transducer configured to be located on a side of the lithium ion battery opposite the at least one transmitting ultrasound transducer.

(4) The apparatus of configurations (1)-(3), wherein: the at least one transmitting ultrasound transducer is configured to transmit at least one ultrasound wave into the lithium ion battery; the at least one receiving ultrasound transducer is configured to receive and measure the at least one ultrasound wave; and the SoC and/or the SoH of the lithium ion battery are determined from the at least one ultrasound wave.

(5) The apparatus of configurations (1)-(4), wherein the at least one transmitting ultrasound transducer is configured to receive and measure a portion of the at least one ultrasound wave that was reflected from an outer boundary of the lithium ion battery or from internal structures within the lithium ion battery, and the SoC and/or the SoH of the lithium ion battery are determined from the portion of the at least one ultrasound wave.

(6) The apparatus of configurations (1)-(5), wherein the at least one transmitting ultrasound transducer and the at least one receiving ultrasound transducer are configured to receive and measure portions of the at least one ultrasound wave that was reflected within the lithium ion battery a plurality of times, and the SoC and/or the SoH of the lithium ion battery are determined from the portions of the at least one ultrasound wave.

(7) The apparatus of configurations (1)-(6), wherein the at least one device comprises at least one strain gauge and/or at least one accelerometer configured to measure vibrations and/or accelerations of the lithium ion battery in response to an external vibrational excitation or a calibrated force to determine the SoC and/or SoH of the lithium ion battery.

(8) The apparatus of configurations (1)-(7), wherein the at least one device comprises at least one electro-optic sensor configured to measure a vibrational response to a vibrational excitation or a calibrated force input on the lithium ion battery.

(9) The apparatus of configurations (1)-(8), wherein the excitation or the calibrated force input on the lithium ion battery is from an electromagnetic shaker, an instrumented hammer, a calibrated spring-loaded impulsive probe, ambient noise generated by environmental conditions around the lithium ion battery, a vibrometer, and/or an acoustic or ultrasonic transducer.

(10) The apparatus of configurations (1)-(9), further comprising a shaker configured to shake the lithium ion battery, and the at least one strain gauge and/or the at least one accelerometer is configured to measure motion of the lithium ion battery in response to the shaker shaking the lithium ion battery, and the SoC and/or the SoH of the lithium ion battery may be determined from the measured motion.

(11) The apparatus of configurations (1)-(10), wherein the at least one device comprises a first and a second acoustic transducer, wherein: the first acoustic transducer is configured to transmit at least one acoustic wave to the lithium ion battery, and to receive and measure a first portion of the at least one acoustic wave reflected from the lithium ion battery; and the second acoustic transducer is configured to receive and measure a second portion of the at least one acoustic wave transmitted through the lithium ion battery.

(12) The apparatus of configurations (1)-(11), further comprising at least one accelerometer configured to measure excitation of the lithium ion battery from the at least one acoustic wave.

(13) The apparatus of configurations (1)-(12), wherein the SoC and/or the SoH of the lithium ion battery are determined from at least the first portion of the at least one acoustic wave, the second portion of the at least one acoustic wave, and the excitation of the lithium ion battery.

(14) The apparatus of configurations (1)-(13), wherein the at least one device comprises: a device for applying a static or dynamic force to the lithium ion battery, wherein the device applies the force to the lithium ion battery, mounted on its edges with a gap beneath, in a direction perpendicular to the plane of the lithium ion battery; and a device for measuring the deflection of the lithium ion battery in response to the force, wherein the SoC and/or the SoH of the lithium ion battery are determined from the deflection.

(15) The apparatus of configurations (1)-(14), wherein the at least one device comprises: a device for applying at least one force to the lithium ion battery, wherein the device applies: a first force to the lithium ion battery in a first direction perpendicular to the plane of the lithium ion battery; and a second force to the lithium ion battery in a second direction, wherein the second direction is opposite the first direction or is a reaction force due to a rigid backing; and a device for measuring a change in the thickness of the lithium ion battery in response to the force, wherein the SoC and/or the SoH of the lithium ion battery are determined from the change in the thickness.

(16) The apparatus of configurations (1)-(15), wherein the at least one device comprises a durometer configured to: create an indentation in a surface of the lithium ion battery; and measure a depth of the indentation in the surface of the lithium ion battery, wherein the SoC and/or the SoH of the lithium ion battery are determined from the depth of the indentation.

(17) The apparatus of configurations (1)-(16), wherein the at least one device comprises a scale configured to measure a weight of the lithium ion battery, and the SoC and/or the SoH of the lithium ion battery are determined from the measured weight of the lithium ion battery.

(18) The apparatus of configurations (1)-(17), wherein the scale is configured to submerge the lithium ion battery in a fluid, and the scale is configured to measure the weight of the lithium ion battery while the lithium ion battery is submerged in the fluid.

(19) The apparatus of configurations (1)-(18), further comprising a device for measuring an amount of fluid displaced by the lithium ion battery while submerged in the fluid, and the SoC and/or the SoH of the lithium ion battery are determined from the measured amount of fluid displaced by the lithium ion battery.

(20) The apparatus of configurations (1)-(19), wherein the at least one device comprises at least one X-ray device.

(21) The apparatus of configurations (1)-(20), wherein the at least one X-ray device comprises: a first X-ray emitter configured to be located on one side of the lithium ion battery; a first X-ray detector configured to be located on a side of the lithium ion battery opposite the first X-ray-emitter; and a second X-ray emitter configured to be located on same side as the first X-ray emitter.

(22) The apparatus of configurations (1)-(21), wherein the first X-ray emitter is configured to transmit at least one package of X-rays into the lithium ion battery; the first X-ray detector is configured to receive and measure a first portion of the at least one package of X-rays transmitted through the lithium ion battery; and the second X-ray detector is configured to receive and measure a second portion of the at least one package of X-rays backscattered from the lithium ion battery; the SoC and/or the SoH of the lithium ion battery are determined at least from the first portion and the second portion of the at least one package of X-rays.

A system for determining the State of Charge (SoC) and/or State of Health (SoH) of a lithium ion battery may be embodied in different configurations. Example configurations may include any combination or combinations of configurations (23) through (44) and (124) as described below.

(23) A system for determining a SoC and SoH of a lithium ion battery, the system comprising: an apparatus comprising at least one device configured to measure physical and/or chemical characteristics of the lithium ion battery; and at least one computing device configured to receive and analyze at least one signal from the apparatus to determine the SoC and the SoH of the lithium ion battery.

(24) The system of configuration (23), wherein the at least one device comprises at least one ultrasound transducer.

(25) The system of configurations (23)-(24), wherein the at least one ultrasound transducer comprises: at least one transmitting ultrasound transducer configured to be located on one side of the lithium ion battery; and at least one receiving ultrasound transducer configured to be located on a side of the lithium ion battery opposite the at least one transmitting ultrasound transducer.

(26) The system of configurations (23)-(25), wherein: the at least one transmitting ultrasound transducer is configured to transmit at least one ultrasound wave into the lithium ion battery; the at least one receiving ultrasound transducer is configured to receive and measure the at least one ultrasound wave; and the SoC and/or the SoH of the lithium ion battery are determined from the at least one ultrasound wave.

(27) The system of configurations (23)-(26), wherein the at least one transmitting ultrasound transducer is configured to receive and measure a portion of the at least one ultrasound wave that was reflected from a boundary of the lithium ion battery or an internal structure within the lithium ion battery, and the SoC and/or the SoH of the lithium ion battery are determined from the portion of the at least one ultrasound wave.

(28) The system of configurations (23)-(27), wherein the at least one transmitting ultrasound transducer and the at least one receiving ultrasound transducer are configured to receive and measure portions of the at least one ultrasound wave that was reflected within the lithium ion battery a plurality of times, and the SoC and/or the SoH of the lithium ion battery are determined from the portions of the at least one ultrasound wave.

(29) The system of configurations (23)-(28), wherein the at least one device comprises at least one strain gauge and/or at least one accelerometer configured to measure vibrations and/or accelerations of the lithium ion battery in response to an external stimulus or a calibrated force to determine the SoC and/or SoH of the lithium ion battery.

(30) The system of configurations (23)-(29), wherein the at least one device comprises at least one electro-optic sensor configured to measure a vibrational response to an external stimulus or a calibrated force input on the lithium ion battery.

(31) The system of configurations (23)-(30), wherein the calibrated force input or the external stimulus on the lithium ion battery is from an electromagnetic shaker, an instrumented hammer, a calibrated spring-loaded impulsive probe, ambient noise generated by environmental conditions around the lithium ion battery, a vibrometer, and/or an acoustic or ultrasonic transducer.

(32) The system of configurations (23)-(31), further comprising a shaker configured to shake the lithium ion battery, and the at least one strain gauge and/or the at least one accelerometer is configured to measure motion of the lithium ion battery in response to the shaker shaking the lithium ion battery, and the SoC and/or the SoH of the lithium ion battery may be determined from the measured motion.

(33) The system of configurations (23)-(32), wherein the at least one device comprises a first and a second acoustic (audio frequency) transducer, wherein: the first acoustic transducer is configured to transmit at least one acoustic wave to the lithium ion battery, and to receive and measure a first portion of the at least one acoustic wave reflected from the lithium ion battery; and the second acoustic transducer is configured to receive and measure a second portion of the at least one acoustic wave transmitted through the lithium ion battery.

(34) The system of configurations (23)-(33), further comprising at least one accelerometer configured to measure excitation of the lithium ion battery from the at least one acoustic wave.

(35) The system of configurations (23)-(34), wherein the SoC and/or the SoH of the lithium ion battery are determined from at least the first portion of the at least one acoustic wave, the second portion of the at least one acoustic wave, and the excitation of the lithium ion battery.

(36) The system of configurations (23)-(35), wherein the at least one device comprises: a device for applying a static or dynamic force to the lithium ion battery, wherein the device applies the force to the lithium ion battery, suspended by its edges with a gap beneath, in a direction perpendicular to the plane of the lithium ion battery; and a device for measuring the deflection of the lithium ion battery in response to the force, wherein the SoC and/or the SoH of the lithium ion battery are determined from the deflection.

(37) The system of configurations (23)-(36), wherein the at least one device comprises: a device for applying at least one force to the lithium ion battery, wherein the device applies: a first force to the lithium ion battery in a first direction perpendicular to the plane of the lithium ion battery; and a second force to the lithium ion battery in a second direction, wherein the second direction is opposite the first direction, or the second force is a reaction force due to a rigid backing; and a device for measuring a change in the thickness of the lithium ion battery in response to the force, wherein the SoC and/or the SoH of the lithium ion battery are determined from the change in the thickness.

(38) The system of configurations (23)-(37), wherein the at least one device comprises a durometer configured to: create an indentation in a surface of the lithium ion battery; and measure a depth of the indentation in the surface of the lithium ion battery, wherein the SoC and/or the SoH of the lithium ion battery are determined from the depth of the indentation.

(39) The system of configurations (23)-(38), wherein the at least one device comprises a scale configured to measure a weight of the lithium ion battery, and the SoC and/or the SoH of the lithium ion battery are determined from the measured weight of the lithium ion battery.

(40) The system of configurations (23)-(39), wherein the scale is configured to submerge the lithium ion battery in a fluid, and the scale is configured to measure the weight of the lithium ion battery while the lithium ion battery is submerged in the fluid.

(41) The system of configurations (23)-(40), further comprising a device for measuring an amount of fluid displaced by the lithium ion battery while submerged in the fluid, and the SoC and the SoH of the lithium ion battery are determined from the measured amount of fluid displaced by the lithium ion battery.

(42) The system of configurations (23)-(41), wherein the at least one device comprises at least one X-ray device.

(43) The system of configurations (23)-(42), wherein the at least one X-ray device comprises: a first X-ray emitter configured to be located on one side of the lithium ion battery; a first X-ray detector configured to be located on a side of the lithium ion battery opposite the first X-ray emitter; and a second X-ray detector configured to be located on the same side as the X-ray emitter.

(44) The system of configurations (23)-(43), wherein: the first X-ray emitter is configured to transmit at least one package of X-rays into the lithium ion battery; the first X-ray detector is configured to receive and measure a first portion of the at least one package of X-rays transmitted through the lithium ion battery; the second X-ray receiver is configured to receive and measure a second portion of the at least one package of X-rays backscattered from the lithium ion battery; the SoC and/or the SoH of the lithium ion battery are determined at least from the first portion and the second portion of the at least one package of X-rays.

An apparatus for disrupting an SSEI layer of a lithium ion battery may be embodied in different configurations. Example configurations may include any combination or combinations of configurations (45) through (72) and (125) as described below.

(45) An apparatus for disrupting a Secondary Solid Electrolyte Interphase (SSEI) layer of a lithium ion battery, the apparatus comprising: at least one device configured to disrupt the SSEI layer of the lithium ion battery.

(46) The apparatus of configuration (45), wherein the at least one device comprises a plurality of ultrasound transducers.

(47) The apparatus of configurations (45)-(46), wherein the plurality of ultrasound transducers are configured to transmit high energy ultrasound waves into the lithium ion battery to disrupt the SSEI layer.

(48) The apparatus of configurations (45)-(47), wherein a frequency of the high energy ultrasound waves is equal to a resonant frequency of the molecular bonds of the SSEI layer.

(49) The apparatus of configurations (45)-(48), wherein the high energy ultrasound waves are designed to cause cavitation in the SSEI layer.

(50) The apparatus of configurations (45)-(49), wherein the high energy ultrasound waves are designed to excite one or more structural resonances in an anode and/or a cathode of the lithium ion battery.

(51) The apparatus of configurations (45)-(50), wherein the high energy ultrasound waves comprise continuous waves, tone bursts, impulses, and/or chirps.

(52) The apparatus of configurations (45)-(51), wherein the plurality of ultrasound transducers utilize phased array ultrasound.

(53) The apparatus of configurations (45)-(52), wherein the plurality of ultrasound transducers are configured to transmit ultrasound waves into the lithium ion battery such that the ultrasound waves constructively interfere at a desired location.

(54) The apparatus of configurations (45)-(53), wherein the ultrasound waves constructively interfere at the SSEI layer to disrupt the SSEI layer.

(55) The apparatus of configurations (45)-(54), wherein the ultrasound waves constructively interfere at the desired location by setting a predetermined phase shift between ultrasound transducers of the plurality of ultrasound transducers.

(56) The apparatus of configurations (45)-(55), wherein the at least one device comprises at least one X-ray emitter.

(57) The apparatus of configurations (45)-(56), wherein the at least one X-ray emitter is configured to transmit X-rays into the lithium ion battery to disrupt the SSEI layer.

(58) The apparatus of configurations (45)-(57), wherein an energy of the transmitted X-rays is determined by absorption properties of the SSEI layer.

(59) The apparatus of configurations (45)-(58), wherein the at least one X-ray emitter is configured to transmit X-rays into the lithium ion battery in a direction parallel to the plane of the lithium ion battery to induce plasmon resonances in the lithium ion battery.

(60) The apparatus of configurations (45)-(59), wherein the at least one device comprises at least one current source, and the at least one current source is configured to drive an alternating current through the lithium ion battery at frequencies that induce strong resonant structure responses to disrupt the SSEI layer.

(61) The apparatus of configurations (45)-(60), wherein the at least one current source is connected to an anode and a cathode of the lithium ion battery.

(62) The apparatus of configurations (45)-(61), wherein the at least one device comprises circuitry configured to generate energetic conditions similar to a short circuit to create strong electronic forces within the lithium ion battery to disrupt the SSEI layer.

(63) The apparatus of configurations (45)-(62), wherein the circuitry is configured to generate energetic conditions similar to a short circuit within the lithium ion battery by placing a low impedance across an anode and a cathode of the lithium ion battery, and forcing a large current through the lithium ion battery.

(64) The apparatus of configurations (45)-(63), wherein the at least one device comprises an external rocker configured to drive electrolyte the lithium ion battery into harmonic horizontal motion to disrupt the SSEI layer.

(65) The apparatus of configurations (45)-(64), wherein the external rocker is configured to drive the electrolyte of the lithium ion battery into harmonic horizontal motion by rocking the external rocker about an axis perpendicular to the plane of the lithium ion battery.

(66) The apparatus of configurations (45)-(65), wherein the external rocker is configured to drive the electrolyte of the lithium ion battery into harmonic horizontal motion to generate shear stress on the surface of an anode and cathode of the lithium ion battery to disrupt the SSEI layer.

(67) The apparatus of configurations (45)-(66), wherein the at least one device comprises a rotation device configured to rotate the lithium ion battery to disrupt the SSEI layer.

(68) The apparatus of configurations (45)-(67), wherein the rotation device is configured to rotate the lithium ion battery about an axis perpendicular to the plane of the lithium ion battery.

(69) The apparatus of configurations (45)-(68), wherein the rotation device is configured to rotate the lithium ion battery with a continuous rotation or an oscillating rotation to induce flow within the electrolyte of the lithium ion battery and to induce high shear on the SSEI layer to disrupt the SSEI layer.

(70) The apparatus of configurations (45)-(69), wherein the at least one device comprises at least one high energy ultrasound transducer configured to transmit a high energy ultrasound wave parallel to the surfaces of an anode and cathode of the lithium ion battery to generate streaming in the electrolyte of the lithium ion battery and to generate high shear forces to disrupt the SSEI layer.

(71) The apparatus of configurations (45)-(70), wherein the at least one device comprises a device to control an environment of the lithium ion battery to disrupt the SSEI layer.

(72) The apparatus of configurations (45)-(71), wherein the device to control the environment of the lithium ion battery is configured to apply or to remove heat from the lithium ion battery.

Methods for determining a SoC and SoH of a lithium ion battery may include various processes. Example methods may include any combination or combinations of processes (73) through (94) and (126) as described below.

(73) A method for determining a State of Charge (SoC) and/or State of Health (SoH) of a lithium ion battery, the method comprising: measuring, with at least one device, physical and/or chemical characteristics of the lithium ion battery; and determining the SoC and/or the SoH of the lithium ion battery from the measured physical and/or chemical characteristics.

(74) The method of configuration (73), wherein the at least one device comprises at least one ultrasound transducer.

(75) The method of configurations (73)-(74), wherein the at least one ultrasound transducer comprises: at least one transmitting ultrasound transducer configured to be located on one side of the lithium ion battery; and at least one receiving ultrasound transducer configured to be located on a side of the lithium ion battery opposite the at least one transmitting ultrasound transducer.

(76) The method of configurations (73)-(75), wherein: the at least one transmitting ultrasound transducer is configured to transmit at least one ultrasound wave into the lithium ion battery; the at least one receiving ultrasound transducer is configured to receive and measure the at least one ultrasound wave; and the SoC and/or the SoH of the lithium ion battery are determined from the at least one ultrasound wave.

(77) The method of configurations (73)-(76), wherein the at least one transmitting ultrasound transducer is configured to receive and measure a portion of the at least one ultrasound wave that was reflected from an outer boundary of the lithium ion battery or internal structures within the lithium ion battery, and the SoC and/or the SoH of the lithium ion battery are determined from the portion of the at least one ultrasound wave.

(78) The method of configurations (73)-(77), wherein the at least one transmitting ultrasound transducer and the at least one receiving ultrasound transducer are configured to receive and measure portions of the at least one ultrasound wave that was reflected within the lithium ion battery a plurality of times, and the SoC and/or the SoH of the lithium ion battery are determined from the portions of the at least one ultrasound wave.

(79) The method of configurations (73)-(78), wherein the at least one device comprises at least one strain gauge and/or at least one accelerometer configured to measure vibrations and/or accelerations of the lithium ion battery in response to an external vibrational stimulus or a calibrated force, and the SoC and/or SoH of the lithium ion battery are determined from the measured vibrations and/or accelerations.

(80) The method of configurations (73)-(79), wherein the at least one device comprises at least one electro-optic sensor configured to measure a vibrational response to an external vibrational stimulus or a calibrated force input on the lithium ion battery.

(81) The method of configurations (73)-(80), wherein the calibrated force input or the external stimulus on the lithium ion battery is from an electromagnetic shaker or a vibrometer, an instrumented hammer, a calibrated spring-loaded impulsive probe, ambient noise generated by environmental conditions around the lithium ion battery, and/or an acoustic or ultrasonic transducer.

(82) The method of configurations (73)-(81), further comprising a shaker configured to shake the lithium ion battery, and the at least one strain gauge, the at least one accelerometer, and/or the at least one electro-optic sensor is configured to measure motion of the lithium ion battery in response to the shaker shaking the lithium ion battery, and the SoC and/or the SoH of the lithium ion battery may be determined from the measured motion.

(83) The method of configurations (73)-(82), wherein the at least one device comprises a first and a second acoustic transducer, wherein: the first acoustic transducer is configured to transmit at least one acoustic wave to the lithium ion battery, and to receive and measure a first portion of the at least one acoustic wave reflected from the lithium ion battery; and the second acoustic transducer is configured to receive and measure a second portion of the at least one acoustic wave transmitted through the lithium ion battery.

(84) The method of configurations (73)-(83), further comprising at least one accelerometer configured to measure excitation of the lithium ion battery from the at least one acoustic wave.

(85) The method of configurations (73)-(84), wherein the SoC and/or the SoH of the lithium ion battery are determined from at least the first portion of the at least one acoustic wave, the second portion of the at least one acoustic wave, and the excitation of the lithium ion battery.

(86) The method of configurations (73)-(85), wherein the at least one device comprises: a device for applying a static or dynamic force to the lithium ion battery, wherein the device applies the force to the lithium ion battery, mounted on its edges with a gap beneath, in a direction perpendicular to the plane of the lithium ion battery; and a device for measuring the deflection of the lithium ion battery in response to the force, wherein the SoC and/or the SoH of the lithium ion battery are determined from the deflection.

(87) The method of configurations (73)-(86), wherein the at least one device comprises: a device for applying at least one force to the lithium ion battery, wherein the device applies: a first force to the lithium ion battery in a first direction perpendicular to the plane of the lithium ion battery; and a second force to the lithium ion battery in a second direction, wherein the second direction is opposite the first direction, or is a reaction force due to a rigid backing; and a device for measuring a change in the thickness of the lithium ion battery in response to the force, wherein the SoC and/or the SoH of the lithium ion battery are determined from the change in the thickness.

(88) The method of configurations (73)-(87), wherein the at least one device comprises a durometer configured to: create an indentation in a surface of the lithium ion battery; and measure a depth of the indentation in the surface of the lithium ion battery, wherein the SoC and/or the SoH of the lithium ion battery are determined from the depth of the indentation.

(89) The method of configurations (73)-(88), wherein the at least one device comprises a scale configured to measure a weight of the lithium ion battery, and the SoC and/or the SoH of the lithium ion battery are determined from the measured weight of the lithium ion battery.

(90) The method of configurations (73)-(89), wherein the scale is configured to submerge the lithium ion battery in a fluid, and the scale is configured to measure the weight of the lithium ion battery while the lithium ion battery is submerged in the fluid.

(91) The method of configurations (73)-(90), further comprising a device for measuring an amount of fluid displaced by the lithium ion battery while submerged in the fluid, and the SoC and/or the SoH of the lithium ion battery are determined from the measured amount of fluid displaced by the lithium ion battery.

(92) The method of configurations (73)-(91), wherein the at least one device comprises at least one X-ray device.

(93) The method of configurations (73)-(92), wherein the at least one X-ray device comprises: a first X-ray emitter configured to be located on one side of the lithium ion battery; a first X-ray detector configured to be located on a side of the lithium ion battery opposite the first X-ray emitter; and a second X-ray detector configured to be located on the same side of the lithium ion battery as the first X-ray emitter.

(94) The method of configurations (73)-(93), wherein the first X-ray emitter is configured to transmit at least one package of X-rays into the lithium ion battery; the first X-ray detector is configured to receive and measure a first portion of the at least one package of X-rays transmitted through the lithium ion battery; and the second X-ray detector is configured to receive and measure a second portion of the at least one package of X-rays backscattered from the lithium ion battery; the SoC and/or the SoH of the lithium ion battery are determined at least from the first portion and the second portion of the at least one package of X-rays.

Methods for rejuvenating a lithium ion battery may include various processes. Example methods may include any combination or combination of processes (95) through (122) and (127) as described below.

(95) A method for rejuvenating a lithium ion battery, the method comprising: disrupting a Secondary Solid Electrolyte Interphase (SSEI) layer of the lithium ion battery with at least one device.

(96) The method of configuration (95), wherein the at least one device comprises a plurality of ultrasound transducers.

(97) The method of configurations (95)-(96), wherein the plurality of ultrasound transducers are configured to transmit high energy ultrasound waves into the lithium ion battery to disrupt the SSEI layer.

(98) The method of configurations (95)-(97), wherein a frequency of the high energy ultrasound waves is equal to a resonant frequency of the molecular bonds of the SSEI layer.

(99) The method of configurations (95)-(98), wherein the high energy ultrasound waves are designed to cause cavitation in the SSEI layer.

(100) The method of configurations (95)-(99), wherein the high energy ultrasound waves are designed to excite structural resonances at an anode and/or a cathode of the lithium ion battery.

(101) The method of configurations (95)-(100), wherein the high energy ultrasound waves comprise continuous waves, tone bursts, impulses, and/or chirps.

(102) The method of configurations (95)-(101), wherein the plurality of ultrasound transducers utilize phased array ultrasound.

(103) The method of configurations (95)-(102), wherein the plurality of ultrasound transducers are configured to transmit ultrasound waves into the lithium ion battery such that the ultrasound waves constructively interfere at a desired location.

(104) The method of configurations (95)-(103), wherein the ultrasound waves constructively interfere at the SSEI layer to disrupt the SSEI layer.

(105) The method of configurations (95)-(104), wherein the ultrasound waves constructively interfere at the desired location by setting a predetermined phase shift between ultrasound transducers of the plurality of ultrasound transducers.

(106) The method of configurations (95)-(105), wherein the at least one device comprises at least one X-ray emitter.

(107) The method of configurations (95)-(106), wherein the at least one X-ray emitter is configured to transmit X-rays into the lithium ion battery to disrupt the SSEI layer.

(108) The method of configurations (95)-(107), wherein an energy of the transmitted X-rays is determined by absorption properties of the SSEI layer.

(109) The method of configurations (95)-(108), wherein the at least one X-ray emitter is configured to transmit X-rays into the lithium ion battery in a direction parallel to the plane of the lithium ion battery to induce plasmon resonances in the battery.

(110) The method of configurations (95)-(109), wherein the at least one device comprises at least one current source, and the at least one current source is configured to drive an alternating current through the lithium ion battery at a frequency of structural resonances to disrupt the SSEI layer.

(111) The method of configurations (95)-(110), wherein the at least one current source is connected to an anode and a cathode of the lithium ion battery.

(112) The method of configurations (95)-(111), wherein the at least one device comprises circuitry configured to generate energetic conditions similar to a short circuit to create strong electronic forces within the lithium ion battery to disrupt the SSEI layer.

(113) The method of configurations (95)-(112), wherein the circuitry is configured to generate energetic conditions similar to a short circuit to create strong electronic forces within short the lithium ion battery by placing a low impedance across an anode and a cathode of the lithium ion battery, and forcing a large current through the lithium ion battery.

(114) The method of configurations (95)-(113), wherein the at least one device comprises an external rocker configured to drive electrolyte of the lithium ion battery into harmonic horizontal motion to disrupt the SSEI layer.

(115) The method of configurations (95)-(114), wherein the external rocker is configured to drive the lithium ion battery electrolyte into harmonic horizontal motion by rocking the external rocker about an axis perpendicular to the plane of the lithium ion battery.

(116) The method of configurations (95)-(115), wherein the external rocker is configured to drive the lithium ion battery electrolyte into harmonic horizontal motion to generate shear stress on the surface of an anode and cathode of the lithium ion battery to disrupt the SSEI layer.

(117) The method of configurations (95)-(116), wherein the at least one device comprises a rotation device configured to rotate the lithium ion battery to disrupt the SSEI layer.

(118) The method of configurations (95)-(117), wherein the rotation device is configured to rotate the lithium ion battery about an axis perpendicular to the plane of the lithium ion battery.

(119) The method of configurations (95)-(118), wherein the rotation device is configured to rotate the lithium ion battery with a continuous rotation or an oscillating rotation to induce flow within electrolyte of the lithium ion battery and to induce high shear on the SSEI layer to disrupt the SSEI layer.

(120) The method of configurations (95)-(119), wherein the at least one device comprises at least one high energy ultrasound transducer configured to transmit a high energy ultrasound wave parallel to the surfaces of an anode and cathode of the lithium ion battery to generate streaming in electrolyte of the lithium ion battery and to generate high shear forces to disrupt the SSEI layer.

(121) The method of configurations (95)-(120), wherein the at least one device comprises a device to control an environment of the lithium ion battery to disrupt the SSEI layer.

(122) The method of configurations (95)-(121), wherein the device to control the environment of the lithium ion battery is configured to apply or to remove heat from the lithium ion battery.

(123) The apparatus of configurations (1)-(22), wherein a thickness of an SSEI layer of the lithium ion battery is determined from the SoC and/or the SoH of the lithium ion battery.

(124) The system of configurations (23)-(44), wherein a thickness of an SSEI layer of the lithium ion battery is determined from the SoC and/or the SoH of the lithium ion battery.

(125) The method of configurations (73)-(94), further comprising: determining a thickness of an SSEI layer of the lithium ion battery from the SoC and/or the SoH of the lithium ion battery.

(126) The apparatus of configurations (45)-(72), further comprising: a device configured to reduce a temperature of the lithium ion battery to minimize potential collateral damage to the lithium ion battery, wherein the device configured to reduce the temperature of the lithium ion battery may be configured to reduce the temperature of the lithium ion battery during one or more of the abovementioned methods to disrupt the SSEI layer.

(127) The method of configurations (95)-(122), further comprising: reducing a temperature of the lithium ion battery to minimize potential collateral damage to the lithium ion battery, wherein the step of reducing the temperature of the lithium ion battery may occur before, during, or after one or more of the abovementioned methods to disrupt the SSEI layer.

What is claimed is:

1. An apparatus for restoring capacity to a lithium ion battery, the apparatus comprising:
one or more transducers configured to transmit, without charging or discharging of the lithium ion battery, acoustic or ultrasonic energy into the lithium ion battery so as to disrupt at least one Secondary Solid Electrolyte Interphase (SSEI) layer of the lithium ion battery.

2. The apparatus of claim 1, wherein the one or more transducers comprises a plurality of ultrasound transducers.

3. The apparatus of claim 2, wherein the plurality of ultrasound transducers are configured to transmit ultrasound waves into the lithium ion battery, and at least one frequency of the ultrasound waves is equal to a resonant frequency of molecular bonds of the at least one SSEI layer.

4. The apparatus of claim 2, wherein the plurality of ultrasound transducers are configured to transmit ultrasound waves into the lithium ion battery, and the ultrasound waves are designed to cause cavitation of an electrolyte of the lithium ion battery.

5. The apparatus of claim 2, wherein the plurality of ultrasound transducers are configured to transmit ultrasound waves into the lithium ion battery, and the ultrasound waves are designed to excite one or more structural resonances in at least one electrode of the lithium ion battery.

6. The apparatus of claim 2, wherein the plurality of ultrasound transducers are configured to transmit ultrasound waves into the lithium ion battery, and the ultrasound waves comprise continuous waves, tone bursts, impulses, chirps, narrowband pulses, broadband pulses, or any combination thereof.

7. The apparatus of claim 2, wherein the plurality of ultrasound transducers are arranged in an array, and each ultrasound transducer is configured to transmit ultrasound waves into the lithium ion battery such that the ultrasound waves constructively interfere at a location selected to cause disruption of the at least one SSEI layer.

8. The apparatus of claim 7, wherein the ultrasound waves constructively interfere at the location selected to cause disruption of the at least one SSEI layer by setting a predetermined phase shift between the ultrasound transducers of the array.

9. The apparatus of claim 7, wherein the location is within the at least one SSEI layer.

10. The apparatus of claim 2, further comprising a controller operatively coupled to the plurality of ultrasound transducers and configured to:
    detect an SSEI layer within the lithium ion battery; and
    control the plurality of ultrasound transducers to transmit the ultrasonic energy into the lithium ion battery in response to the detected SSEI layer.

11. The apparatus of claim 1, further comprising a controller operatively coupled to the one or more transducers, the controller comprising a processor and computer readable storage media storing instructions that, when executed by the processor, cause the controller to:
    (a) charge or discharge the lithium ion battery; and
    (b) after (a), transmit, via the one or more transducers, the acoustic or ultrasonic energy into the battery without charging or discharging the lithium ion battery such that the SSEI layer is disrupted.

12. A method for restoring capacity to a lithium ion battery, the method comprising:
    (a) transmitting, without charging or discharging of the lithium ion battery, acoustic or ultrasonic energy into the lithium ion battery so as to disrupt at least one Secondary Solid Electrolyte Interphase (SSEI) layer of the lithium ion battery.

13. The method of claim 12, wherein the transmitting of (a) comprises transmitting ultrasound waves into the lithium ion battery.

14. The method of claim 13, comprising causing at least one frequency of the ultrasound waves to be equal to a resonant frequency of one or more molecular bonds of the at least one SSEI layer.

15. The method of claim 13, comprising configuring the ultrasound waves to cause cavitation of an electrolyte of the lithium ion battery.

16. The method of claim 13, comprising configuring the ultrasound waves to excite one or more structural resonances of at least one electrode of the lithium ion battery.

17. The method of claim 13, comprising configuring the ultrasound waves as continuous waves, tone bursts, impulses, chirps, or any combination thereof.

18. The method of claim 13, comprising utilizing an array of ultrasound transducers.

19. The method of claim 18, comprising transmitting, by each transducer in the array of ultrasound transducers, ultrasound waves into the lithium ion battery such that the of ultrasound waves constructively interfere at a location inside the battery.

20. The method of claim 19, wherein said location includes spatial volumes or planes within the lithium ion battery.

21. The method of claim 13, comprising focusing the ultrasound waves.

22. The method of claim 13, comprising configuring the ultrasound waves with an ultrasonic frequency of approximately 20 kilohertz (kHz) or more.

23. The method of claim 12, wherein the transmitting of (a) comprises transmitting acoustic waves into the lithium ion battery.

24. The method of claim 12, wherein the transmitting of (a) comprises creating one or more surface waves between electrodes of the lithium ion battery.

25. The method of claim 12, wherein the transmitting of (a) comprises generating an electrolyte fluid flow parallel to electrode surfaces of the lithium ion battery.

26. The method of claim 12, wherein the transmitting of (a) induces surface shear forces in an electrolyte of the lithium ion battery, the surface shear forces acting on at least one surface of at least one electrode of the lithium ion battery.

27. The method of claim 12, further comprising:
    prior to (a), charging or discharging the lithium ion battery such that all lithium ions are placed on one of the electrodes,
    wherein during the transmitting of (a), all of the lithium ions are retained on said one of the electrodes.

28. The method of claim 12, further comprising:
    prior to (a), cooling the lithium ion battery to a temperature below 298 K,
    wherein during the transmitting of (a), the lithium ion battery is maintained below 298 K.

* * * * *